United States Patent
Shimizu et al.

(10) Patent No.: US 6,781,882 B2
(45) Date of Patent: Aug. 24, 2004

(54) NONVOLATILE SEMICONDUCTOR STORAGE DEVICE HAVING A SHORTENED TIME REQUIRED FOR A DATA ERASING OPERATION AND DATA ERASING METHOD THEREOF

(75) Inventors: Satoshi Shimizu, Tokyo (JP); Mitsuhiro Tomoeda, Tokyo (JP)

(73) Assignees: Renesas Technology Corp., Tokyo (JP); Mitsubishi Electric Engineering Co., Ltd., Tokyo (JP)

( * ) Notice: Subject to any disclaimer, the term of this patent is extended or adjusted under 35 U.S.C. 154(b) by 20 days.

(21) Appl. No.: 10/187,981

(22) Filed: Jul. 3, 2002

(65) Prior Publication Data

US 2003/0133327 A1 Jul. 17, 2003

(30) Foreign Application Priority Data

Jan. 17, 2002 (JP) ........................ 2002-008640

(51) Int. Cl.[7] ................ G11C 16/04; G11C 16/06; G11C 7/02
(52) U.S. Cl. ............... 365/185.19; 365/185.18; 365/185.23; 365/185.24; 365/185.28; 365/185.29; 365/210
(58) Field of Search ................. 365/185.19, 185.18, 365/185.23, 185.24, 185.28, 185.29, 210

(56) References Cited

U.S. PATENT DOCUMENTS

| | | | | |
|---|---|---|---|---|
| 5,467,309 A | * | 11/1995 | Tanaka et al. | 365/185.14 |
| 5,909,390 A | * | 6/1999 | Harari | 365/185.03 |
| 6,014,330 A | * | 1/2000 | Endoh et al. | 365/185.17 |
| 6,327,183 B1 | * | 12/2001 | Pawletko et al. | 365/185.18 |
| 6,373,746 B1 | * | 4/2002 | Takeuchi et al. | 365/185.03 |
| 6,515,909 B1 | * | 2/2003 | Wooldridge | 365/185.22 |
| 6,542,411 B2 | * | 4/2003 | Tanikawa et al. | 365/185.33 |
| 6,580,643 B1 | * | 6/2003 | Satoh et al. | 365/185.22 |
| 2002/0024846 A1 | * | 2/2002 | Kawahara et al. | 365/185.24 |
| 2002/0114207 A1 | * | 8/2002 | Takeuchi et al. | 365/230.03 |
| 2003/0095439 A1 | * | 5/2003 | San et al. | 365/185.22 |
| 2003/0103381 A1 | * | 6/2003 | Han et al. | 365/185.24 |
| 2003/0112671 A1 | * | 6/2003 | Wooldridge | 365/200 |

FOREIGN PATENT DOCUMENTS

JP 11-306769 11/1999

* cited by examiner

Primary Examiner—Huan Hoang
Assistant Examiner—Ly Duy Pham
(74) Attorney, Agent, or Firm—Oblon, Spivak, McClelland, Maier & Neustadt, P.C.

(57) ABSTRACT

It is an object to obtain a nonvolatile semiconductor storage device and a data erasing method thereof in which a time required for a data erasing operation can be shortened. When second and succeeding erasing commands are input at a step SP101, a final voltage value of a batch writing pulse in a last data erasing operation is read from a storage portion (2a) at a step SP102. At a step SP103, next, a control portion (2) sets a starting voltage value of a batch writing pulse in a present data erasing operation based on the final voltage value of the batch writing pulse in the last data erasing operation. For example, in the case in which the final voltage value of the batch writing pulse in the last data erasing operation is $V_{WL}=8.00$ V and $V_{Well}=V_{SL}=-6.00$ V, the starting voltage value of the batch writing pulse is currently set to $V_{WL}=7.75$ V and $V_{Well}=V_{SL}=-5.75$ V with a reduction of one step.

18 Claims, 36 Drawing Sheets

F I G. 1 1
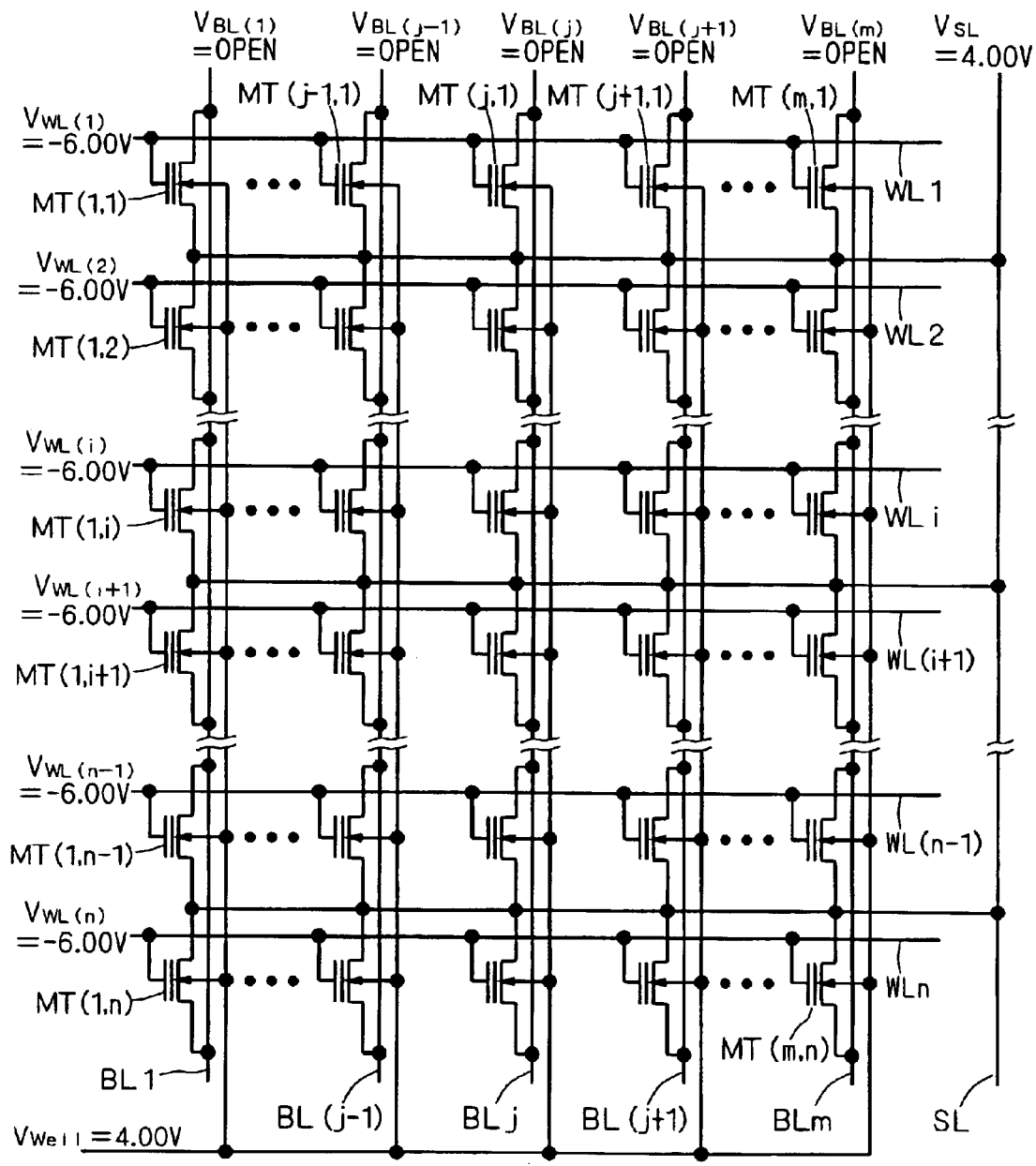

F I G. 1 6
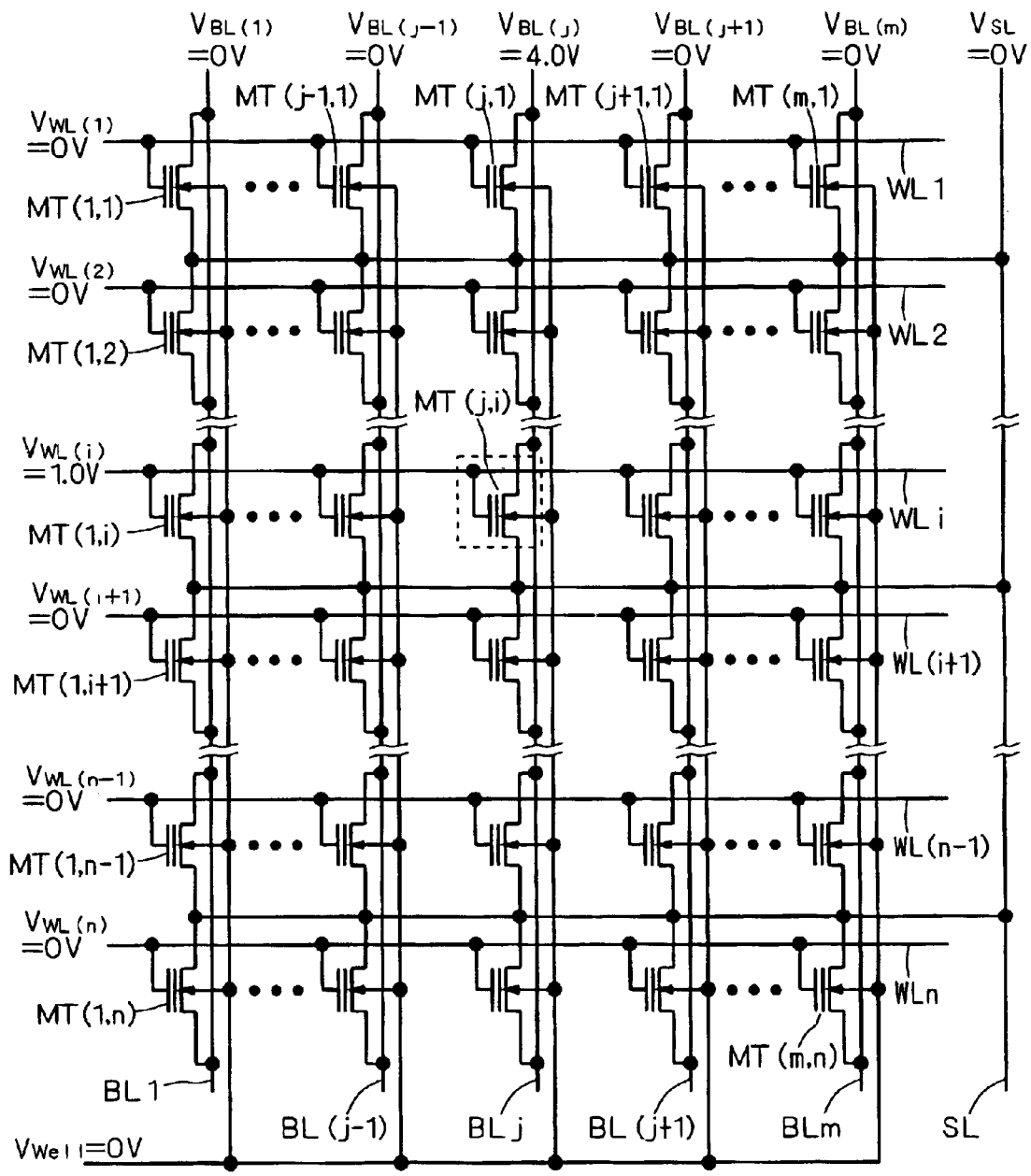

F I G. 25
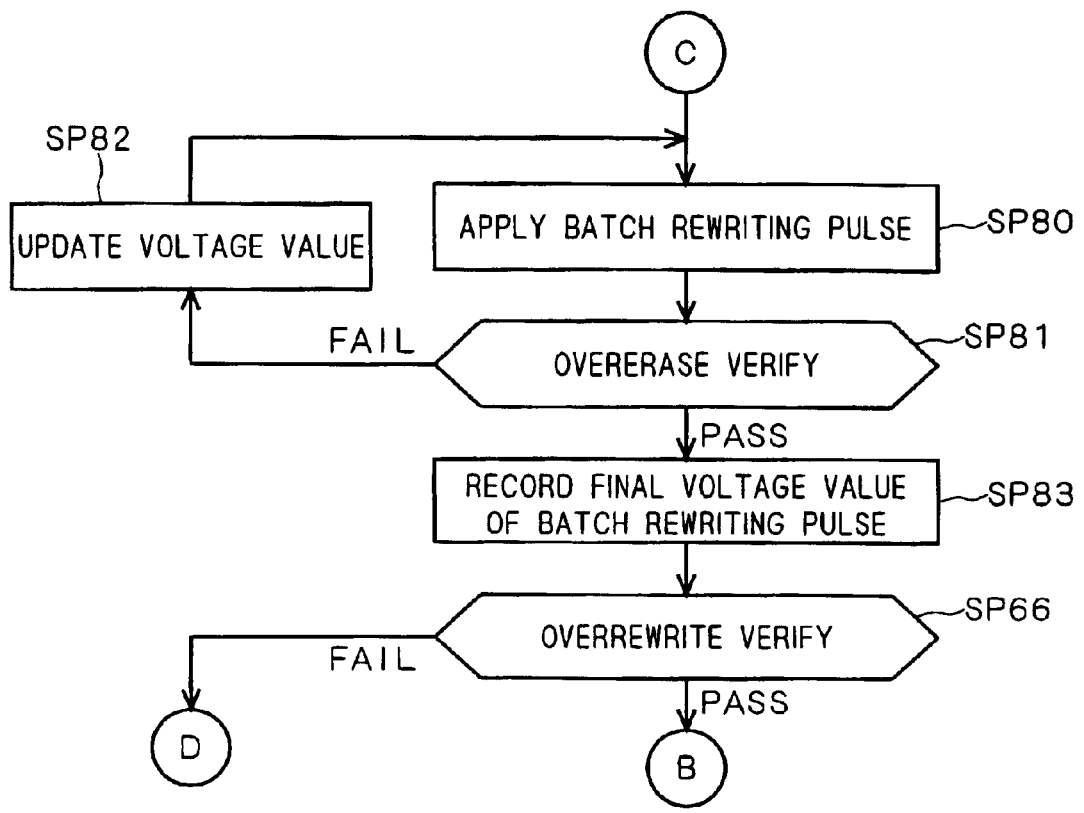
F I G. 26
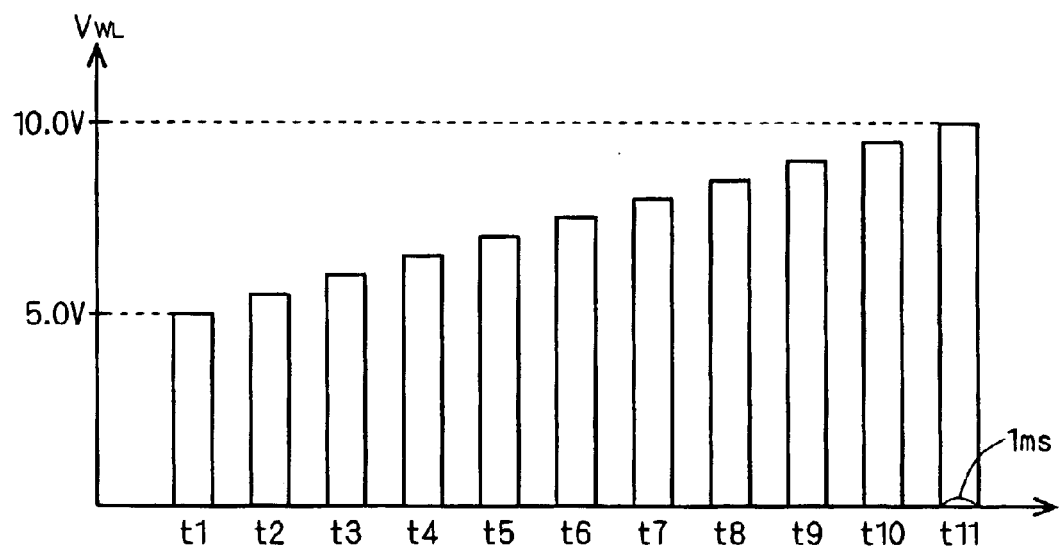

F I G. 36
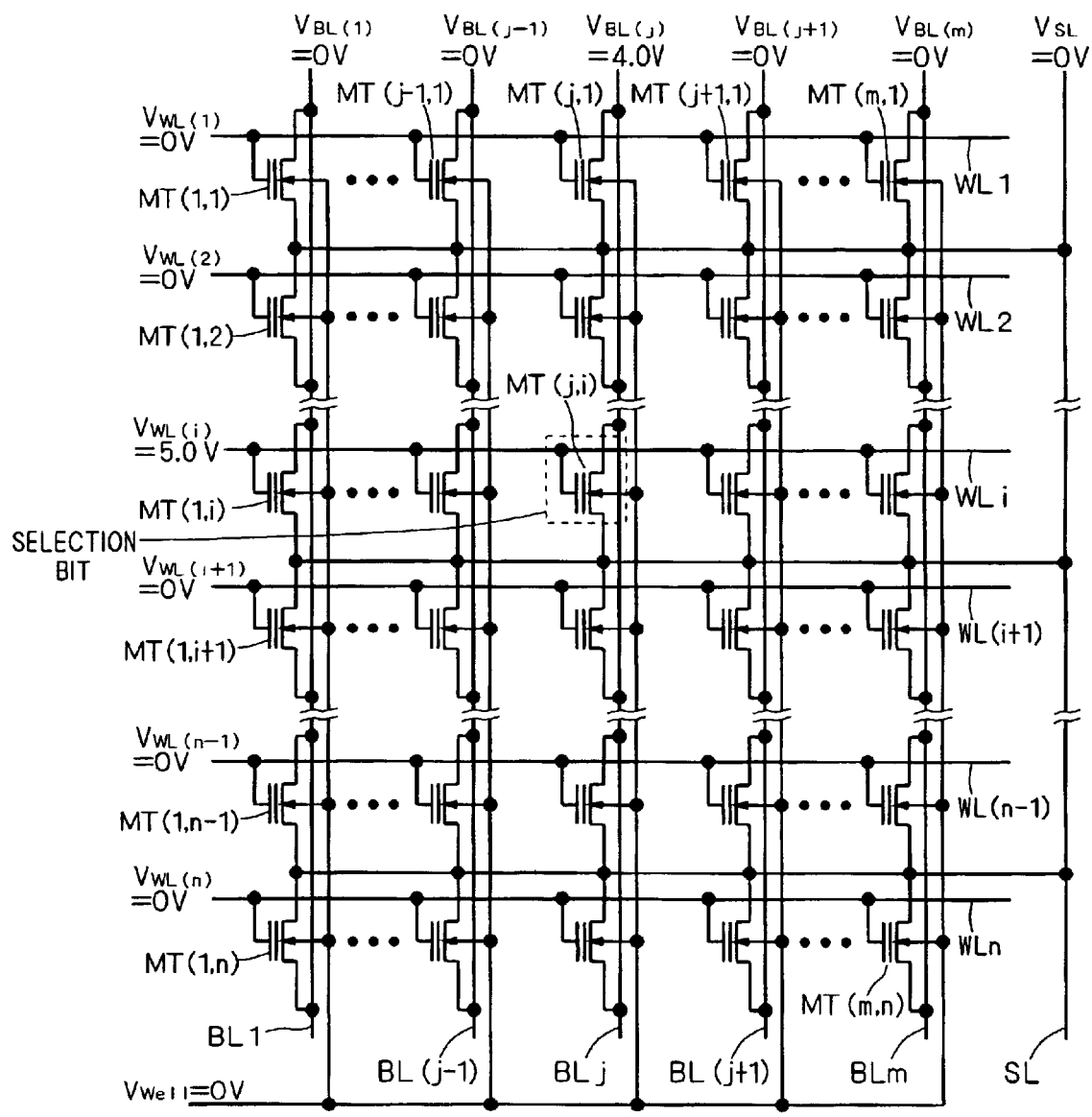

NONVOLATILE SEMICONDUCTOR STORAGE DEVICE HAVING A SHORTENED TIME REQUIRED FOR A DATA ERASING OPERATION AND DATA ERASING METHOD THEREOF

BACKGROUND OF THE INVENTION

1. Field of the Invention

The present invention relates to a nonvolatile semiconductor storage device and a data erasing method thereof, and more particularly to a flash memory and a data erasing method thereof.

2. Description of the Background Art

A flash memory is a nonvolatile semiconductor storage device capable of electrically writing and erasing data. The flash memory comprises a memory cell array having a plurality of memory cells provided in a matrix, and each memory cell includes a memory cell transistor having a floating gate. A threshold voltage of the memory cell transistor is changed depending on whether an electron is accumulated in the floating gate, and data are stored in a memory cell depending on a difference in the threshold voltage.

At present, the mainstream of the flash memory is an NOR type flash memory. In this specification, description will be given by taking, as an example, a so-called channel whole surface extraction type NOR flash memory in which the electron accumulated in a floating gate is extracted into the whole surface of a channel region in a data erasing operation in the NOR type flash memory.

FIG. 47 is a flow chart for explaining a data erasing operation in a conventional flash memory. When an erasing command is input at a step SP1, a batch writing pulse having a predetermined voltage value and a predetermined pulse width is applied to all memory cell transistors at a step SP2. At a step SP3, next, an erasing pulse having a predetermined voltage value and a predetermined pulse width is applied to all the memory cell transistors.

At a step SP4, next, erase verify is carried out to decide whether or not data of all the memory cells are erased. If there is at least one memory cell in which the data are not erased, that is, a result of the decision in the step SP4 is "FAIL", the process proceeds to a step SP5 in which each of the voltage values of the batch writing pulse and the erasing pulse is updated such that a pulse intensity is increased. Then, the batch writing pulse and the erasing pulse which have the voltage values updated are applied again at the steps SP2 and SP3, respectively. The operations of the steps SP2 to SP5 are repeated until the data of all the memory cells are erased, that is, the result of the decision in the step SP4 is obtained as "PASS".

If the result of the decision in the step SP4 is "PASS", the process proceeds to a step SP6 in which overerase verify is carried out to decide whether or not there is a memory cell transistor set in an overerase state by excessive data erase. If there is no memory cell transistor set in the overerase state, that is, the result of the decision in the step SP6 is "PASS", the process proceeds to a step SP10 and the data erasing operation is thus ended.

If there is at least one memory cell transistor set in the overerase state, that is, a result of the decision in the step SP6 is "FAIL", the process proceeds to a step SP7 in which a rewriting pulse for each bit is applied to the memory cell transistor set in the overerase state. At a step SP8, next, the overerase verify is carried out again in order to decide whether or not all the memory cell transistors set in the overerase state are recovered from the overerase state. If at least one memory cell transistor set in the overerase state is still present, that is, a result of the decision in the step SP8 is "FAIL", the process returns to the step SP7 in which the rewriting pulse for each bit is applied again to the memory cell transistor set in the overerase state. The operations of the steps SP7 and SP8 are repeated until the presence of the memory cell transistor set in the overerase state is eliminated, that is, the result of the decision in the step SP8 is obtained as "PASS".

If the result of the decision in the step SP8 is "PASS", the process proceeds to a step SP9 in which overrewrite verify is carried out to decide whether or not there is a memory cell transistor set in the overrewrite state by excessive data rewrite. If there is no memory cell transistor set in the overrewrite state, that is, a result of the decision in the step SP9 is "PASS", the process proceeds to a step SP10 and the data erasing operation is thus ended.

If there is at least one memory cell transistor set in the overrewrite state, that is, the result of the decision in the step SP9 is "FAIL", the process returns to the step SP2 and the operations at and after the step SP2 are carried out again.

According to the conventional nonvolatile semiconductor storage device and data erasing method thereof, a batch writing pulse and an erasing pulse which have predetermined voltage values and predetermined pulse widths are applied at the first steps SP2 and SP3 to be executed immediately after the step SP1 irrespective of the number of the data erasing operations, for example, irrespective of a first data erasing operation or a 10000th data erasing operation. More specifically, starting voltage values of the pulse intensities of the batch writing pulse and the erasing pulse are constant irrespective of the number of the data erasing operations.

In the flash memory, an electron is injected into a floating gate to write data to a memory cell and the electron is extracted from the floating gate to erase the data of the memory cell. As the number of the data erasing operations is increased, an electron injection efficiency and an electron extraction efficiency are reduced.

According to the conventional nonvolatile semiconductor storage device and data erasing method thereof, however, the starting voltage values of the pulse intensities of the batch writing pulse and the erasing pulse are constant irrespective of the number of the data erasing operations as described above. In the data erasing operation to be carried out after a large number of data erasing operations have already been executed, therefore, there is a higher possibility that the result of the decision in the step SP4 might be "FAIL". At each time, the operations of the steps SP2 to SP4 are repeated. Consequently, there is a problem in that a time required for erasing data is increased.

SUMMARY OF THE INVENTION

In order to solve the problems, it is an object of the present invention to provide a nonvolatile semiconductor storage device and a data erasing method thereof in which a time required for a data erasing operation is shortened.

According to a first aspect of the present invention, a nonvolatile semiconductor storage device includes a memory cell transistor and a control portion having a storage portion and serving to control a voltage pulse to be applied to the memory cell transistor. In a data erasing operation, the control portion gradually increases a pulse intensity and applies a writing pulse until data are written to the memory cell transistor before an erasing pulse is applied. The storage portion stores first information about a final pulse intensity of the writing pulse in a last data erasing operation. The control portion determines a starting value of a pulse intensity of the writing pulse in the data erasing operation based on the first information.

The control portion can determine the starting value of the pulse intensity of the writing pulse in a present data erasing operation to be a proper value based on the first information stored in the storage portion. Also in a data erasing operation to be carried out after a large number of data erasing operations have already been executed, accordingly, it is possible to decrease the number of times that the intensity of the writing pulse is to be increased and to shorten a time required for the data erasing operation.

According to a second aspect of the present invention, a nonvolatile semiconductor storage device includes a memory cell transistor and a control portion having a storage portion and serving to control a voltage pulse to be applied to the memory cell transistor. In a data erasing operation, the control portion gradually increases a pulse intensity and applies an erasing pulse until data of the memory cell transistor are erased. The storage portion stores first information about a final pulse intensity of the erasing pulse in the last data erasing operation. The control portion determines a starting value of the pulse intensity of the erasing pulse in the data erasing operation based on the first information.

The control portion can determine the starting value of the pulse intensity of the erasing pulse in the present data erasing operation to be a proper value based on the first information stored in the storage portion. Also in a data erasing operation to be carried out after a large number of data erasing operations have already been executed, accordingly, it is possible to decrease the number of times that the intensity of the erasing pulse is to be increased and to shorten a time required for the data erasing operation.

According to a third aspect of the present invention, a nonvolatile semiconductor storage device includes a memory cell transistor and a control portion having a storage portion and serving to control a voltage pulse to be applied to the memory cell transistor. In a data erasing operation, the control portion gradually increases a pulse intensity and applies a rewriting pulse until data are rewritten to a memory cell transistor overerased by application of an erasing pulse if the overerased memory cell transistor is present. The storage portion stores information about a final pulse intensity of the rewriting pulse in the last data erasing operation. The control portion determines a starting value of the pulse intensity of the rewriting pulse in the data erasing operation based on the information.

The control portion can determine the starting value of the pulse intensity of the rewriting pulse in the present data erasing operation to be a proper value based on the information stored in the storage portion. Also in a data erasing operation to be carried out after a large number of data erasing operations have already been executed, accordingly, it is possible to decrease the number of times that the intensity of the rewriting pulse is to be increased and to shorten a time required for the data erasing operation.

These and other objects, features, aspects and advantages of the present invention will become more apparent from the following detailed description of the present invention when taken in conjunction with the accompanying drawings.

BRIEF DESCRIPTION OF THE DRAWINGS

FIG. 11 is a circuit diagram showing the memory cell block for explaining the applied voltage in a state in which an erasing pulse is applied at a step SP56, FIG. 16 is a circuit diagram showing the memory cell block for explaining the applied voltage in a state in which a rewriting pulse for each bit is applied at a step SP62, FIG. 25 is a flow chart for explaining a part of a first data erasing method in a nonvolatile semiconductor storage device according to a second variant of the first embodiment of the present invention, FIG. 26 is a chart showing an update status of a voltage value of a batch rewriting pulse at a step SP82, FIG. 36 is a circuit diagram showing the memory cell block for explaining the applied voltage in a state in which a rewriting pulse for each bit is applied at a step SP212.

DESCRIPTION OF THE PREFERRED EMBODIMENTS

First Embodiment

Figure 1:
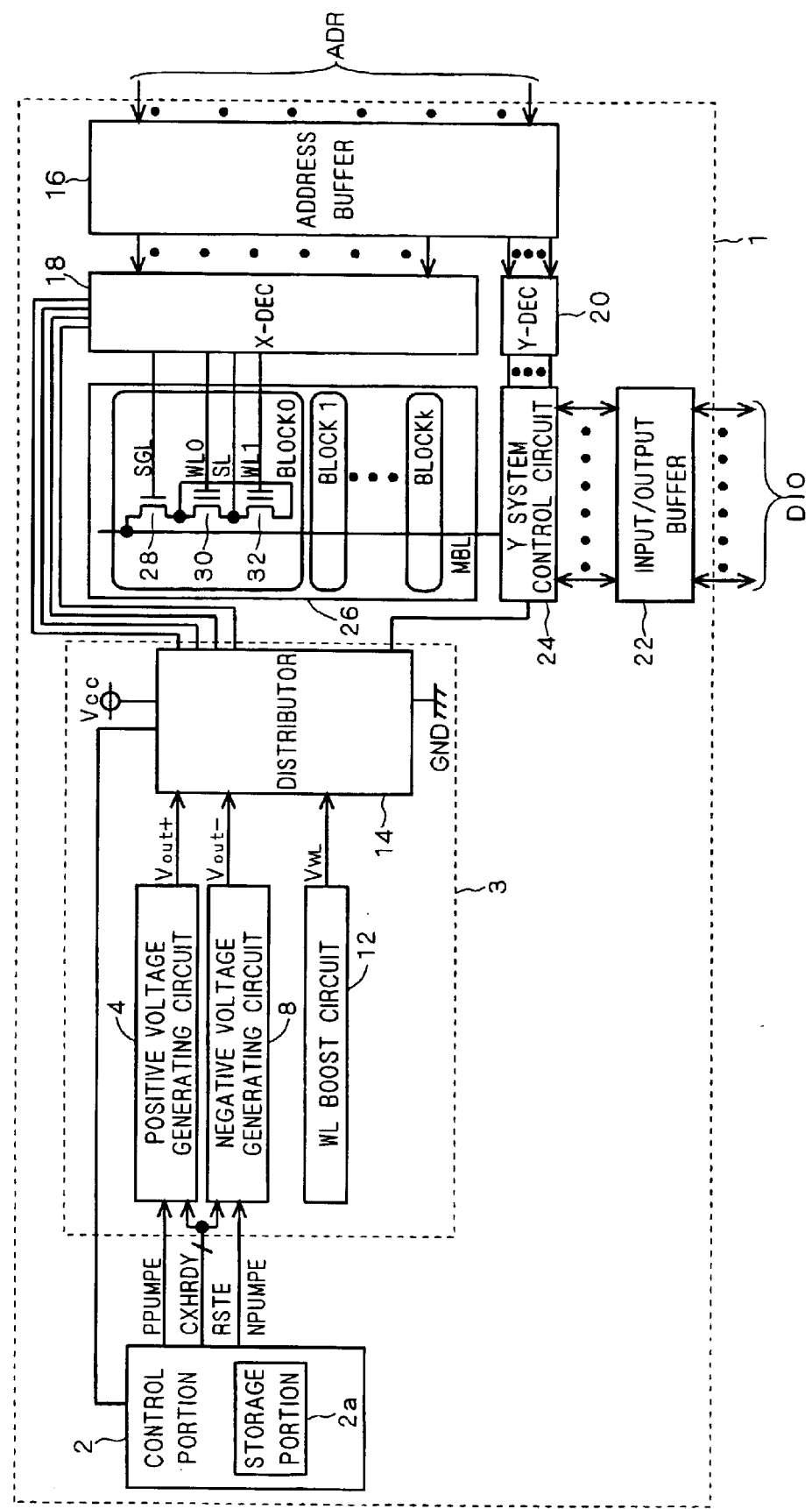
FIG. 1 is a block diagram schematically showing a structure of a nonvolatile semiconductor storage device according to a first embodiment of the present invention.

FIG. 1 is a block diagram schematically showing a structure of a flash type nonvolatile semiconductor storage device 1 according to a first embodiment of the present invention. The nonvolatile semiconductor storage device 1 comprises a control portion 2 for controlling operations for writing and erasing data by controlling a voltage pulse applied to a memory cell transistor. The control portion 2 includes a storage portion 2a having a nonvolatile semiconductor memory such as a flash memory.

Moreover, the nonvolatile semiconductor storage device 1 comprises (A) a voltage generating portion 3 for inputting a standby signal CXHRDY, charge pump activating signals PPUMPE and NPUMPE and a reset signal RSTE from the control portion 2 and for generating and outputting output potentials $V_{out+}$ and $V_{out-}$ and a word line potential $V_{WL}$, (B) an address buffer 16 for inputting an address signal ADR from the outside and for generating and outputting an internal address signal, (C) an X decoder 18 for receiving the supply of the electric potential from the voltage generating portion 3, inputting the internal address signal from the address buffer 16 and determining each of electric potentials of a select gate line SGL, word lines WL0 and WL1, a source line SL and a well, (D) an input/output buffer 22 for transmitting a data input/output signal DIO from/to the outside, (E) a Y decoder 20 for receiving and decoding the internal address signal from the address buffer 16, and (F) a Y system control circuit 24 for applying a high voltage to a main bit line MBL in response to an output signal of the Y decoder 20 and the data input/output signal DIO.

The voltage generating portion 3 includes (G) a positive voltage generating circuit 4 for inputting the standby signal CXHRDY, the charge pump activating signal PPUMPE and the reset signal RSTE from the control portion 2 and for generating the positive output potential $V_{out+}$ based thereon, (H) a negative voltage generating circuit 8 for inputting the standby signal CXHRDY, the charge pump activating signal NPUMPE and the reset signal RSTE from the control portion 2 and for generating the negative output potential $V_{out-}$ based thereon, (I) a WL boost circuit 12 for generating a word line potential $V_{WL}$, and (J) a distributor 14 for distributing the output potentials $V_{out+}$ and $V_{out-}$ and the word line potential $V_{WL}$ to each internal circuit under control of the control portion 2.

The X decoder 18 includes a WL decoder for selecting a word line, an SG decoder for selecting a select gate, a WELL decoder for selecting a well region corresponding to a selected memory block, and an SL decoder for selecting a source line (which are not shown).

Furthermore, the nonvolatile semiconductor storage device 1 comprises a memory cell array 26 having a plurality of memory cells provided in a matrix, and the memory cell array 26 is divided into a plurality of memory cell blocks BLOCK0 to BLOCKk which are formed in different wells and are isolated from each other.

The memory cell block BLOCK0 has memory cell transistors 30 and 32 and a select gate 28. In the memory cell block BLOCK0, two memory cell transistors 30 and 32 are selected corresponding to the select gate line SGL, the word lines WL0 and WL1 and the source line SL which are selected by the X decoder 18. The memory cell transistors 30 and 32 hold data upon receipt of a signal corresponding to the same data from a main bit line MBL. FIG. 1 typically shows only the select gate 28 and memory cell transistors 30 and 32 corresponding to the selected select gate line SGL, word lines WLb0 and WL1 and source line SL.

FIGS. 2 to 5 are flow charts for explaining a first data erasing method in the nonvolatile semiconductor storage device 1 according to the first embodiment. Moreover, FIG. 6 is a chart showing a distribution of a threshold voltage in a state obtained immediately before a data erasing operation is executed, that is, an initial state obtained at time of data erase. An axis of abscissa in FIG. 6 indicates a threshold voltage of a memory cell transistor and an axis of ordinate indicates the number of memory cell transistors in a memory cell block which holds each threshold voltage indicated by the axis of abscissa. With reference to FIG. 6, the initial state obtained at time of the data erase includes a program state, that is, a state in which "0" is stored in the memory cell transistor and an erase state, that is, a state in which "1" is stored in the memory cell transistor.

Figure 2:
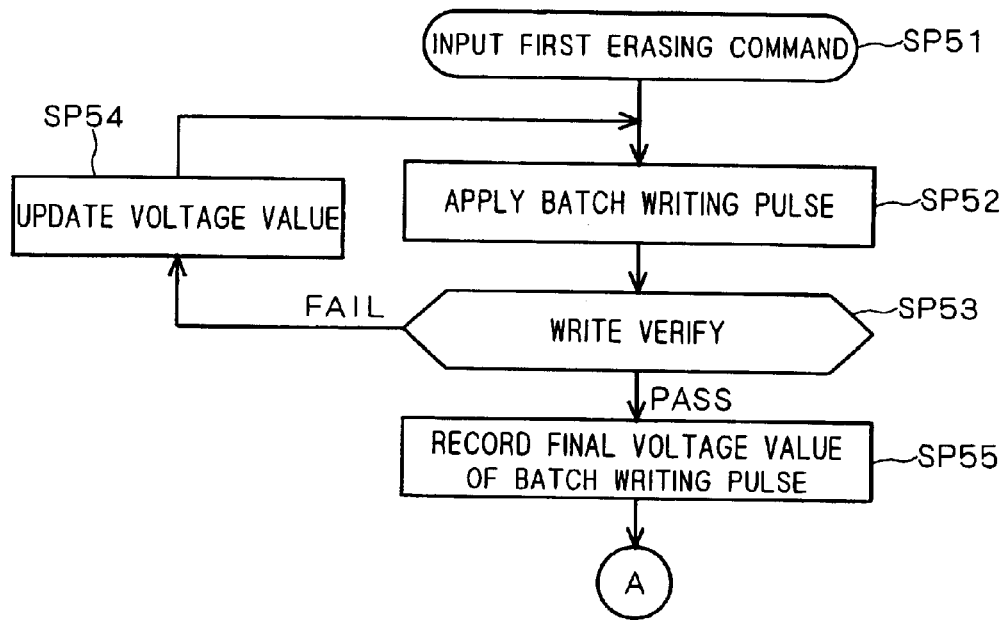
FIGS. 2 to 5 are flow charts for explaining a first data erasing method in the nonvolatile semiconductor storage device according to the first embodiment of the present invention.

With reference to FIG. 2, when a first erasing command is input at a step SP51, a batch writing pulse having a predetermined pulse width (which is set to 1 ms) is applied to all the memory cell transistors at a step SP52. Consequently, batch write is executed in a unit of a memory cell block by using an FN (Fowler-Nordheim) tunnel current.

Figure 7:
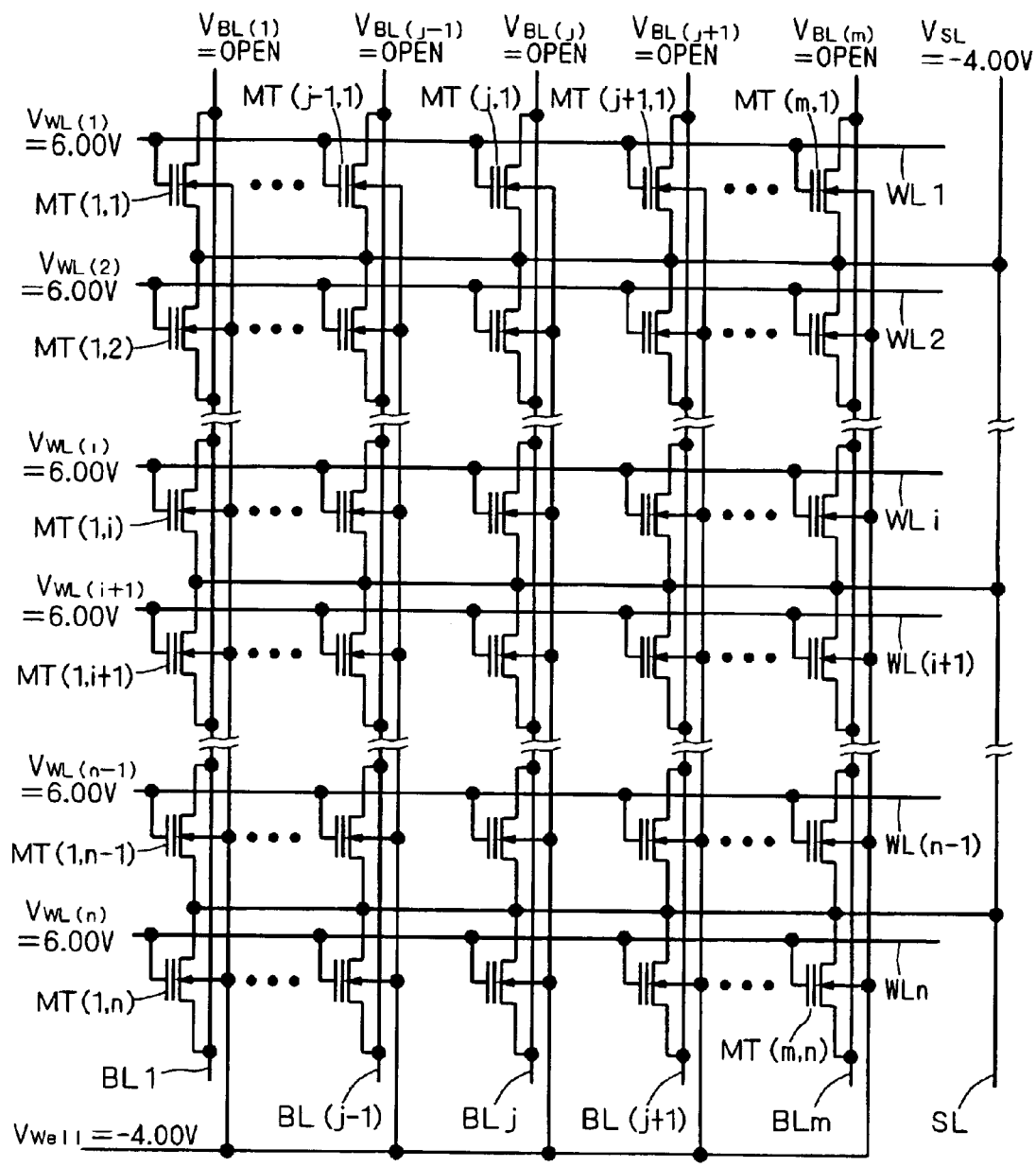
FIG. 7 is a circuit diagram showing a memory cell block for explaining an applied voltage in a state in which a batch writing pulse is applied at a step SP52.

FIG. 7 is a circuit diagram showing the memory cell block for explaining an applied voltage in a state in which the batch writing pulse is applied at the step SP52. With reference to FIG. 7, (n×m) memory cell transistors MTs are provided in total to have an array of n rows and m columns in the memory cell block. At the step SP52, all bit lines BL1 to BLm are set to be open, a pulse voltage of $V_{well}$=−4.00V is applied to the well, a pulse voltage of $V_{SL}$=−4.00V is applied to the source line SL and a pulse voltage of $V_{WL}$=6.00V is applied to all word lines WL1 to WLn.

With reference to FIG. 2, write verify is carried out to decide whether or not data are written to all the memory cells, more specifically, the threshold voltages of all the memory cell transistors are equal to or greater than a predetermined value (which is set to be 5.5 V) at a step SP53 subsequently to the step SP52.

Figure 8:
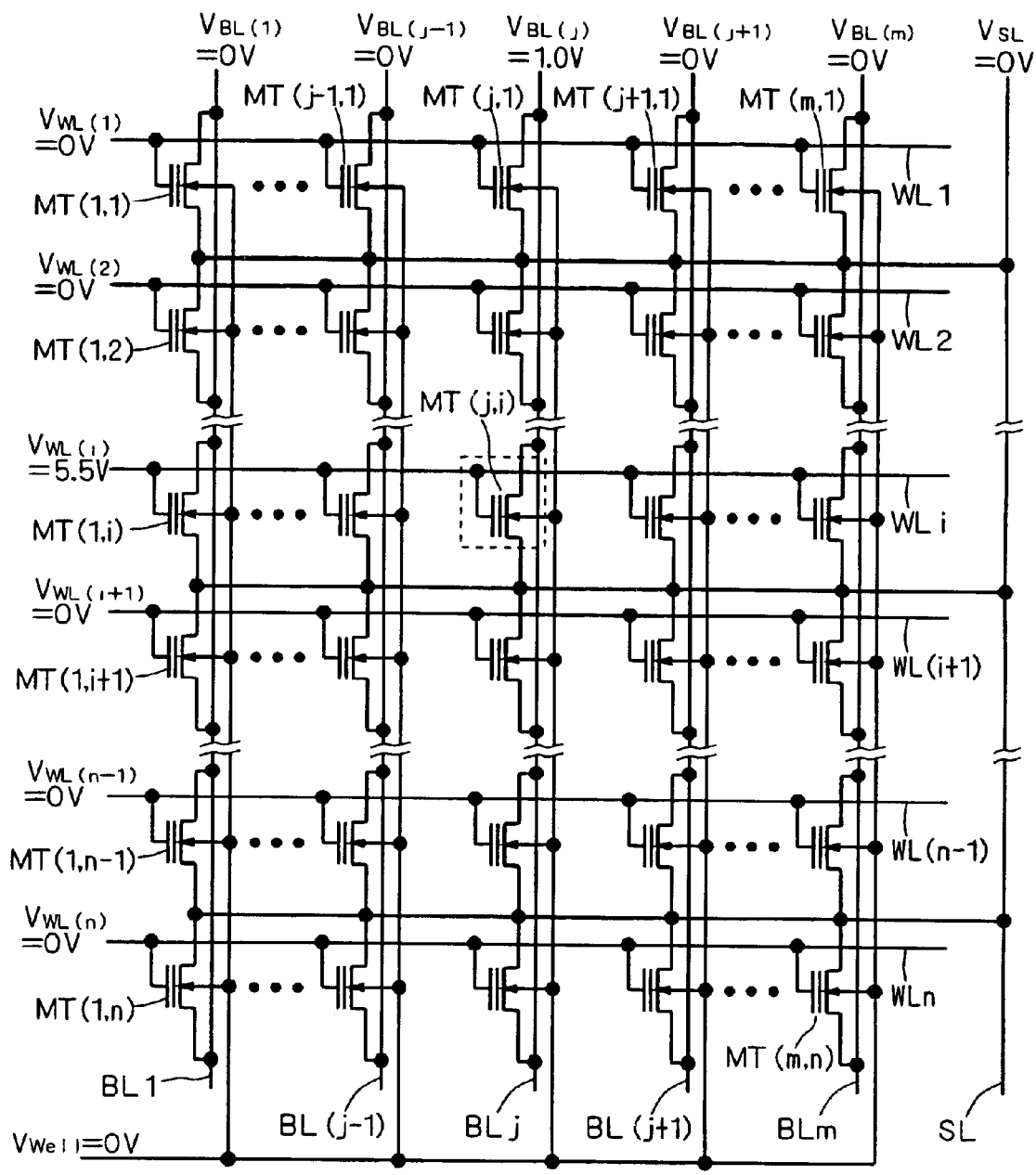
FIG. 8 is a circuit diagram showing the memory cell block for explaining the applied voltage in a state in which write verify is carried out at a step SP53.

FIG. 8 is a circuit diagram showing the memory cell block for explaining an applied voltage in a state in which the write verify is carried out at the step SP53. At the step SP53, a pulse voltage of $V_{BL(j)}$=1.0 V is applied to a bit line BLj connected to a memory cell transistor MT(j, i) corresponding to a selection bit, both the electric potential $V_{Well}$ of the well and the electric potential $V_{SL}$ of the source line SL are set to be 0 V, and a pulse voltage of $V_{WL(i)}$=5.5 V is applied to a word line WLi connected to the memory cell transistor MT(j, i) corresponding to the selection bit.

With reference to FIG. 2, if there is at least one memory cell to which data are not written, that is, a result of the decision in the step S53 is "FAIL", the process proceeds to a step SP54 in which a voltage value of a batch writing pulse is updated to increase a pulse intensity. Then, the batch writing pulse having the voltage value updated is applied again at the step SP52. The operations of the steps SP52 to SP54 are repeated until the data are written to all the memory cells, that is, the result of the decision in the step SP53 is obtained as "PASS".

Figure 9:
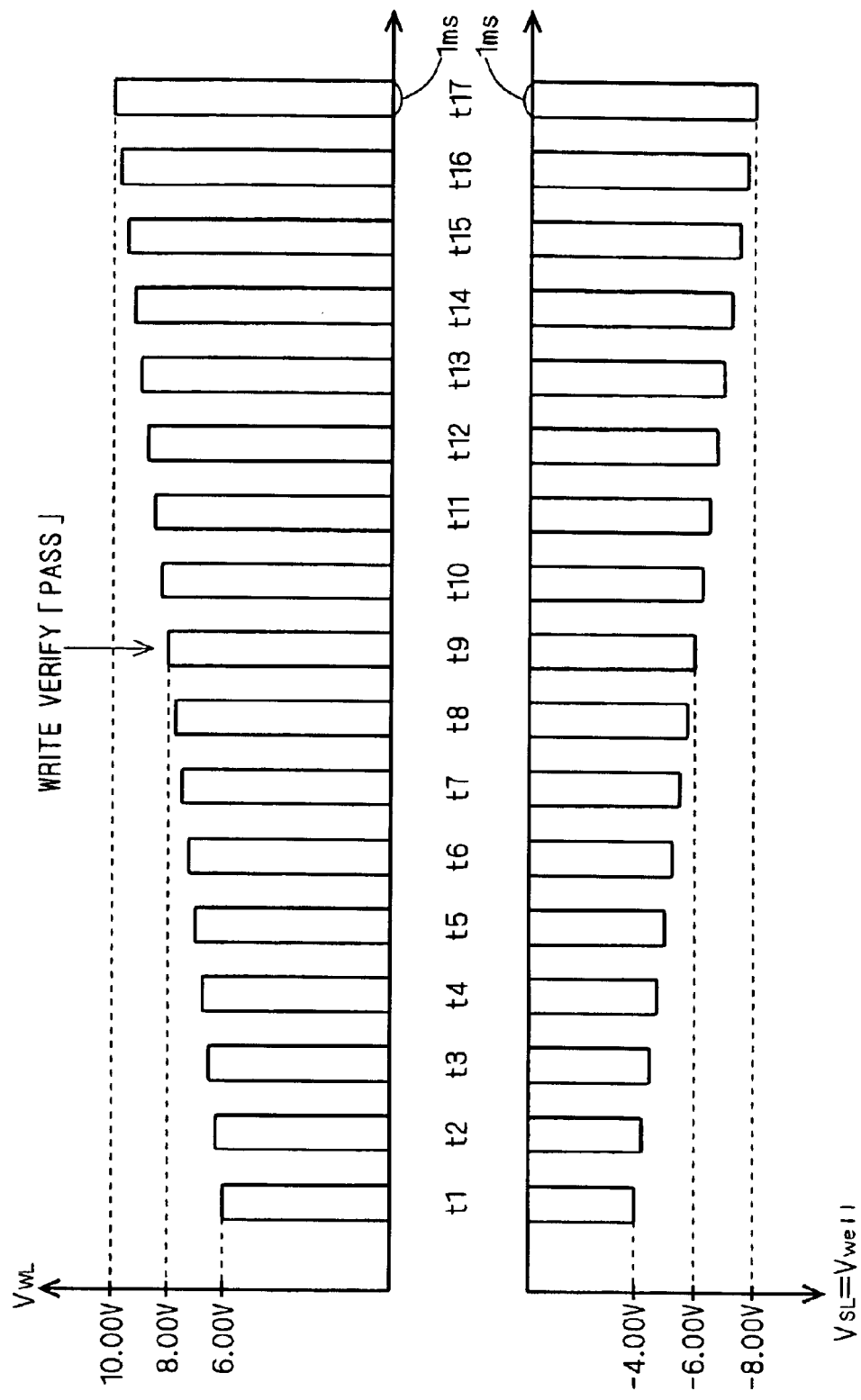
FIG. 9 is a chart showing an update status of a voltage value of a batch writing pulse at a step SP54.

FIG. 9 is a chart showing an update status of the voltage value of the batch writing pulse in the step SP54. The voltage value $V_{WL}$ of the pulse voltage applied to the word line WL is raised from 6.00 V in a first step t1 shown in FIG. 7 to 10.00 V in a seventeenth step t17 every 0.25 V. The voltage values $V_{Well}$ and $V_{SL}$ of the pulse voltages applied to the well and the source line SL are reduced from −4.00 V in the first step t1 shown in FIG. 7 to −8.00 V in the seventeenth step t17 every 0.25 V.

With reference to FIG. 2, if the result of the decision in the step SP53 is "PASS", the process proceeds to a step SP55 in which final voltage values of the batch writing pulse, that is, final values $V_{WL}$, $V_{Well}$ and $V_{SL}$ are recorded in the storage portion 2a shown in FIG. 1. As shown in an example of FIG. 9, if the result of the decision in the step SP53 is obtained as "PASS" in a ninth step t9, information of "batch writing pulse: $V_{WL}$=8.00 V, $V_{Well}$=$V_{SL}$=−6.00 V" is recorded in the storage portion 2a.

Figure 10:
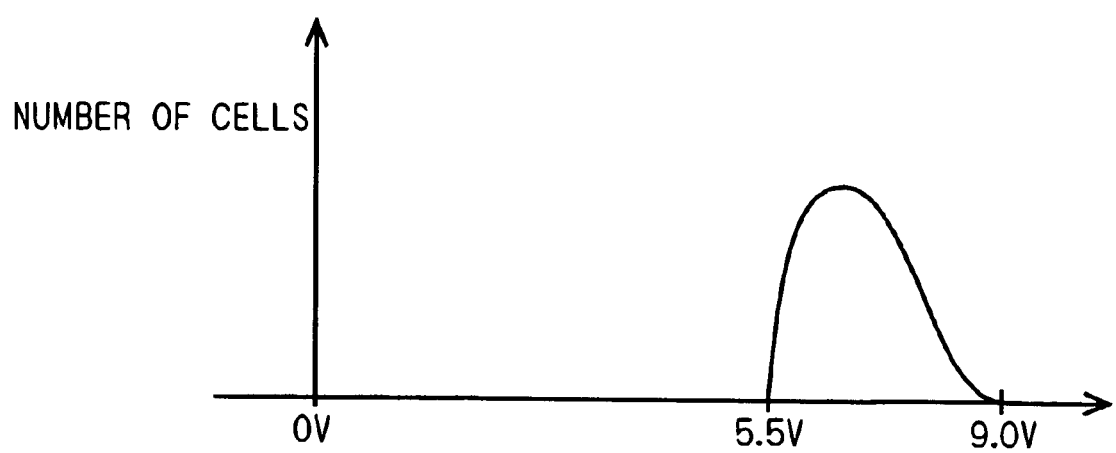
FIG. 10 is a chart showing a distribution of a threshold voltage obtained at time of a decision of "PASS" in the step SP53.

FIG. 10 is a chart showing a distribution of a threshold voltage obtained at time of the decision of "PASS" in the step SP53. At this time, the threshold voltages of all the memory cell transistors in the memory cell block are set to be 5.5 V or more.

Figure 3:
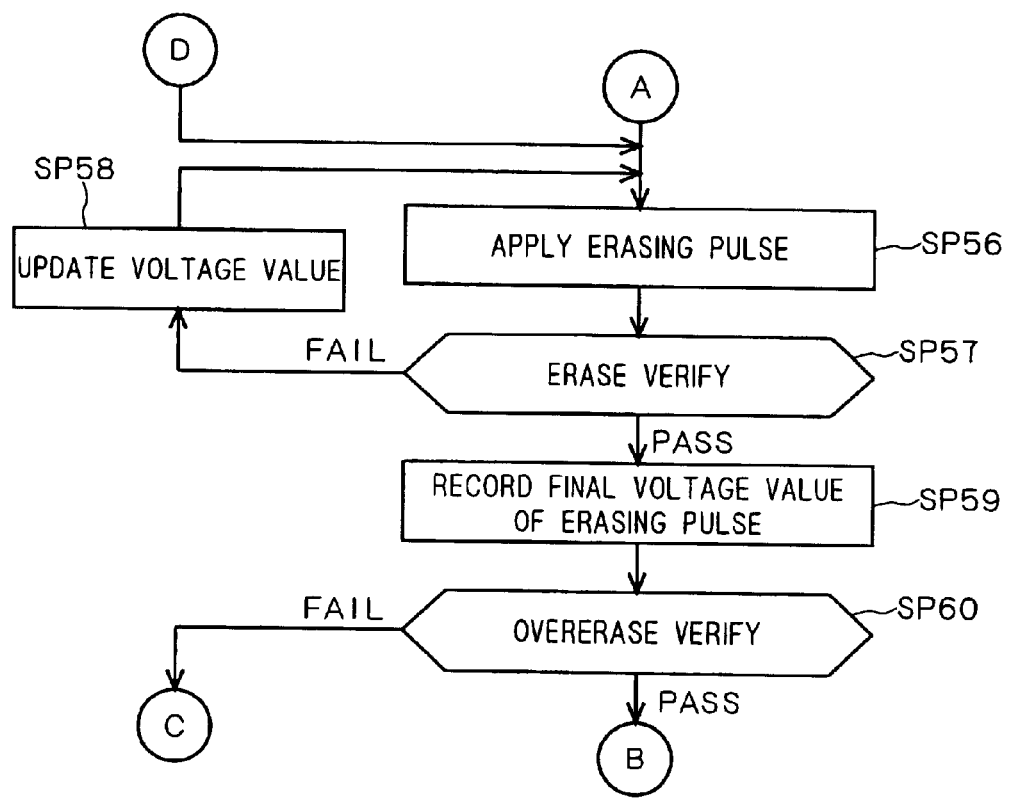

With reference to FIG. 3, an erasing pulse having a predetermined pulse width (which is set to 1 ms) is applied to all the memory cell transistors at a step SP56 subsequently to the step SP55 shown in FIG. 2. Consequently, batch erase is executed in a unit of a memory cell block by using the FN tunnel current.

FIG. 11 is a circuit diagram showing the memory cell block for explaining an applied voltage in a state in which an erasing pulse is applied at the step SP56. At the step SP56, all bit lines BL1 to BLm are set to be open, a pulse voltage of $V_{Well}$=4.00V is applied to the well, a pulse voltage of $V_{SL}$=4.00V is applied to the source line SL and a pulse voltage of $V_{WL}$=−6.00V is applied to all word lines WL1 to WLn.

With reference to FIG. 3, erase verify is carried out to decide whether or not data in all the memory cells are erased, more specifically, the threshold voltages of all the memory cell transistors are smaller than a predetermined value (which is set to be 3.5 V) at a step SP57 subsequently to the step SP56.

Figure 12:
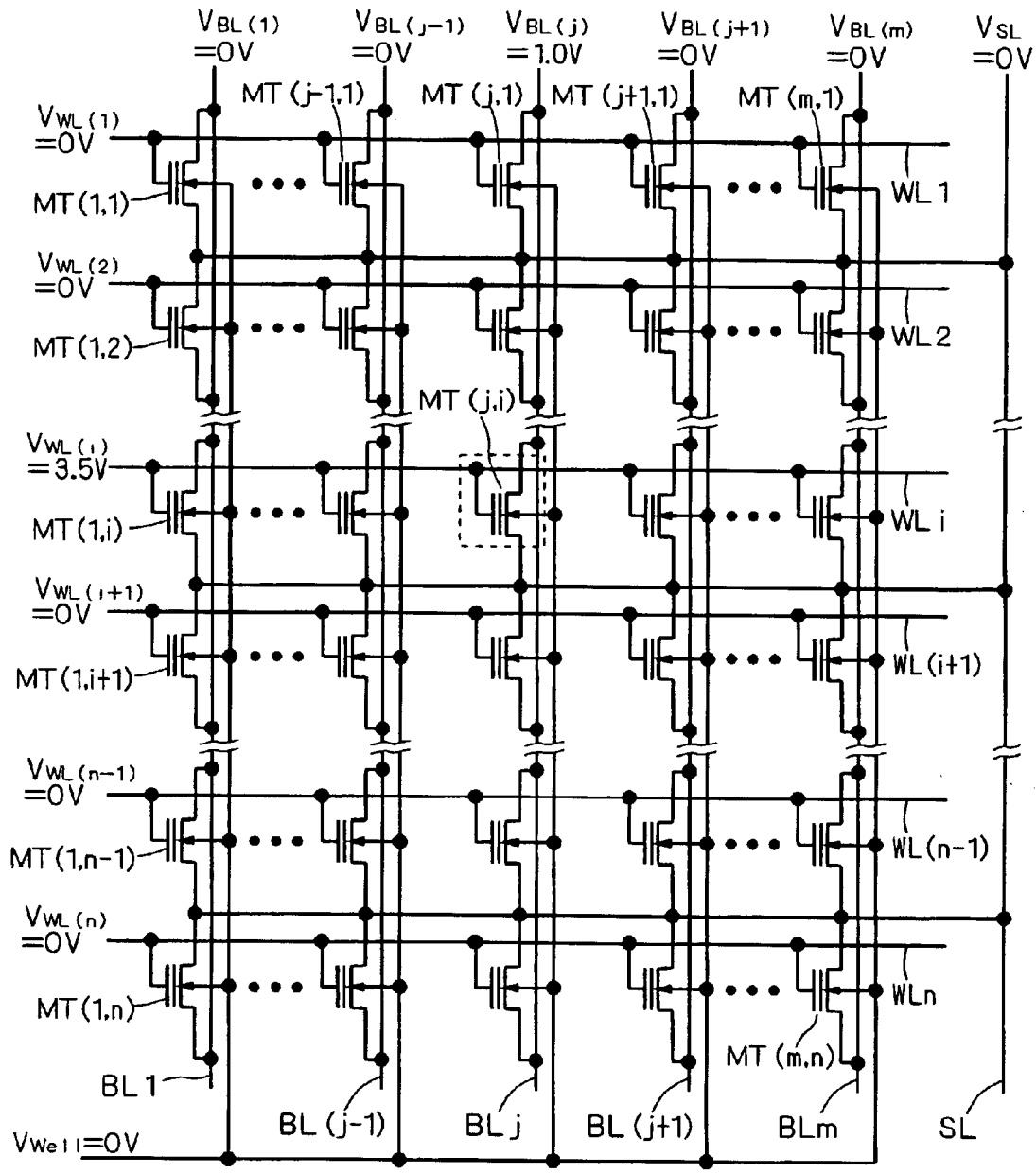
FIG. 12 is a circuit diagram showing the memory cell block for explaining the applied voltage in a state in which erase verify is carried out at a step SP57.

FIG. 12 is a circuit diagram showing the memory cell block for explaining the applied voltage in a state in which the erase verify is carried out at the step SP57. At the step SP57, a pulse voltage of $V_{BL(j)}$=1.0 V is applied to a bit line BLj connected to a memory cell transistor MT (j, i) corresponding to a selection bit, both the electric potential $V_{Well}$ of the well and the electric potential $V_{SL}$ of the source line SL are set to be 0 V, and a pulse voltage of $V_{WL(i)}$=3.5 V is applied to a word line WLi connected to the memory cell transistor MT (j, i) corresponding to the selection bit.

With reference to FIG. 3, if there is at least one memory cell from which data are not erased, that is, a result of the decision in the step S57 is "FAIL", the process proceeds to a step SP58 in which a voltage value of an erasing pulse is updated to increase a pulse intensity. Then, the erasing pulse having the voltage value updated is applied again at the step SP56. The operations of the steps SP56 to SP58 are repeated until the data in all the memory cells are erased, that is, the result of the decision in the step SP57 is obtained as "PASS".

Figure 13:
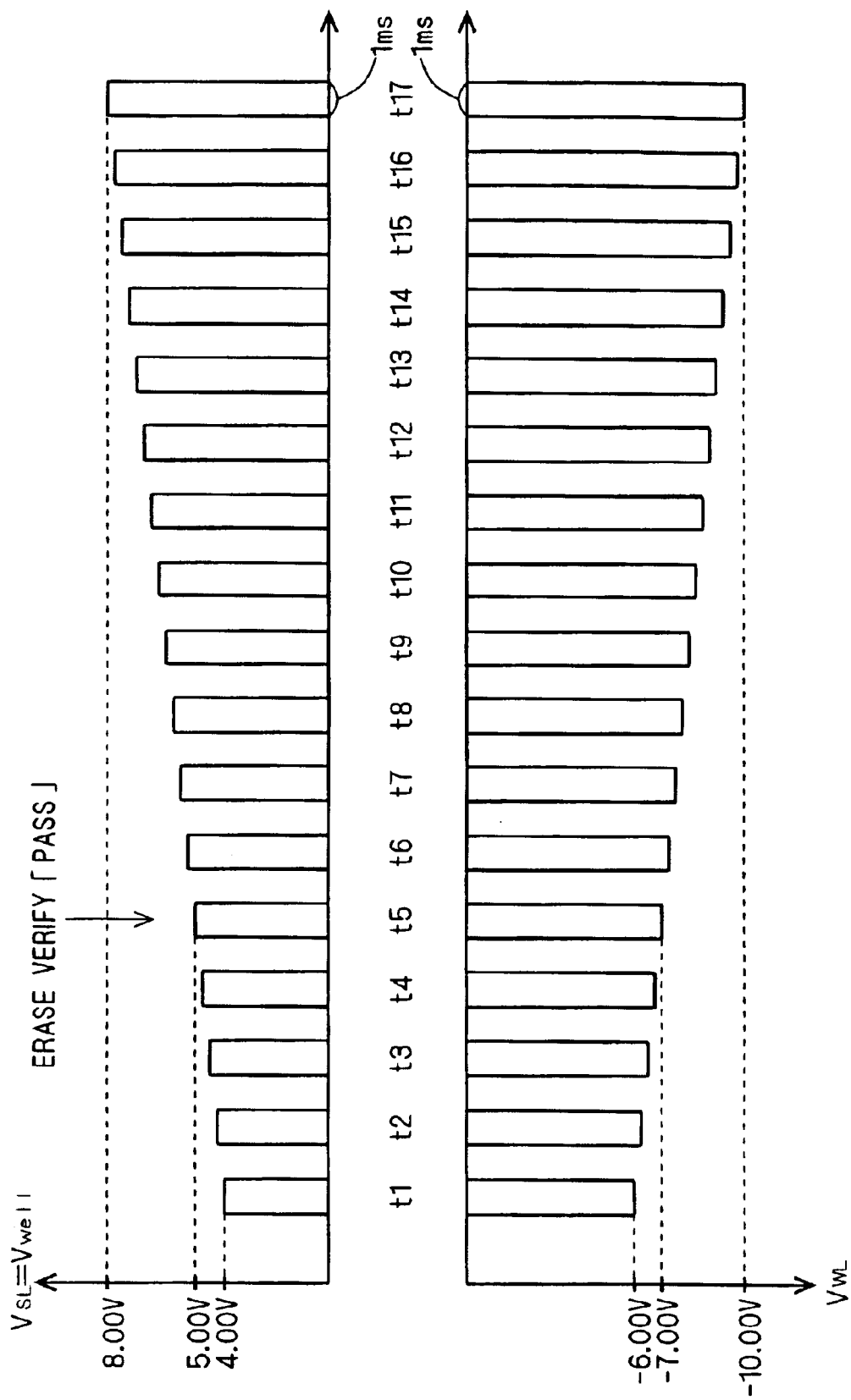
FIG. 13 is a chart showing an update status of a voltage value of the erasing pulse at a step SP58.

FIG. 13 is a chart showing an update status of the voltage value of the erasing pulse in the step SP58. The voltage value $V_{WL}$ of the pulse voltage applied to the word line WL is reduced from −6.00 V in a first step t1 shown in FIG. 11 to −10.00 V in a seventeenth step t17 every 0.25 V. The voltage values $V_{Well}$ and $V_{SL}$ of the pulse voltages applied to the well and the source line SL are raised from 4.00 V in the first step t1 shown in FIG. 11 to 8.00 V in the seventeenth step t17 every 0.25 V.

With reference to FIG. 3, if the result of the decision in the step SP57 is "PASS", the process proceeds to a step SP59 in which final voltage values of the erasing pulse, that is, final values $V_{WL}$, $V_{Well}$ and $V_{SL}$ are recorded in the storage portion 2a shown in FIG. 1. As shown in an example of FIG. 13, if the result of the decision in the step SP57 is obtained as "PASS" in a fifth step t5, information of "erasing pulse:$V_{WL}$=−7.00 V, $V_{Well}$=$V_{SL}$=5.00 V" is recorded in the storage portion 2a.

Figure 14:
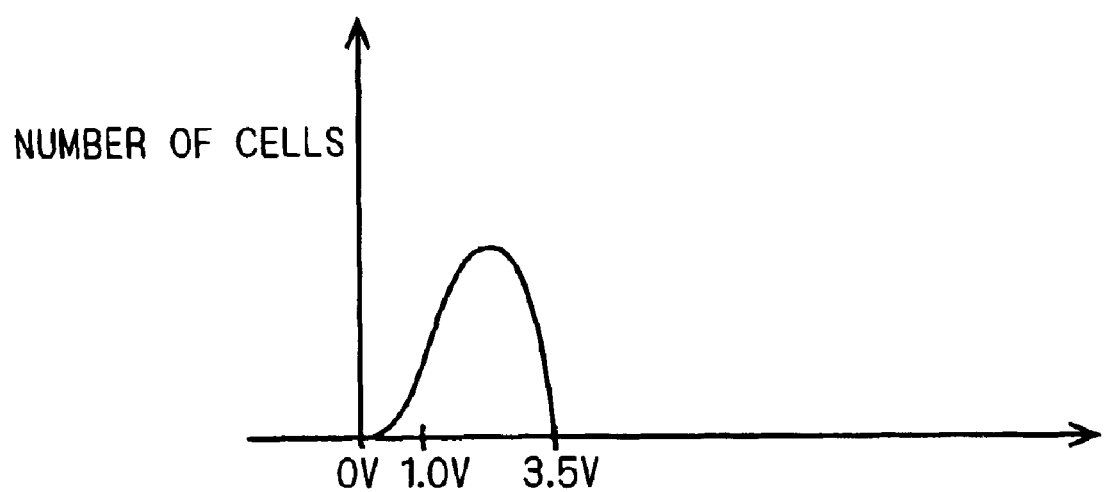
FIG. 14 is a chart showing a distribution of the threshold voltage obtained at time of a decision of "PASS" in the step SP57.

FIG. 14 is a chart showing a distribution of a threshold voltage obtained at time of the decision of "PASS" in the step SP57. At this time, the threshold voltages of all the memory cell transistors in the memory cell block are set to be less than 3.5 V.

With reference to FIG. 3, overerase verify is carried out to decide whether or not there is a memory cell transistor set in an overerase state by excessive data erase, more specifically, the threshold voltages of all the memory cell transistors are set to be equal to or greater than a predetermined value (which is set to be 1.0 V) at a step SP60 subsequently to the step SP59.

Figure 15:
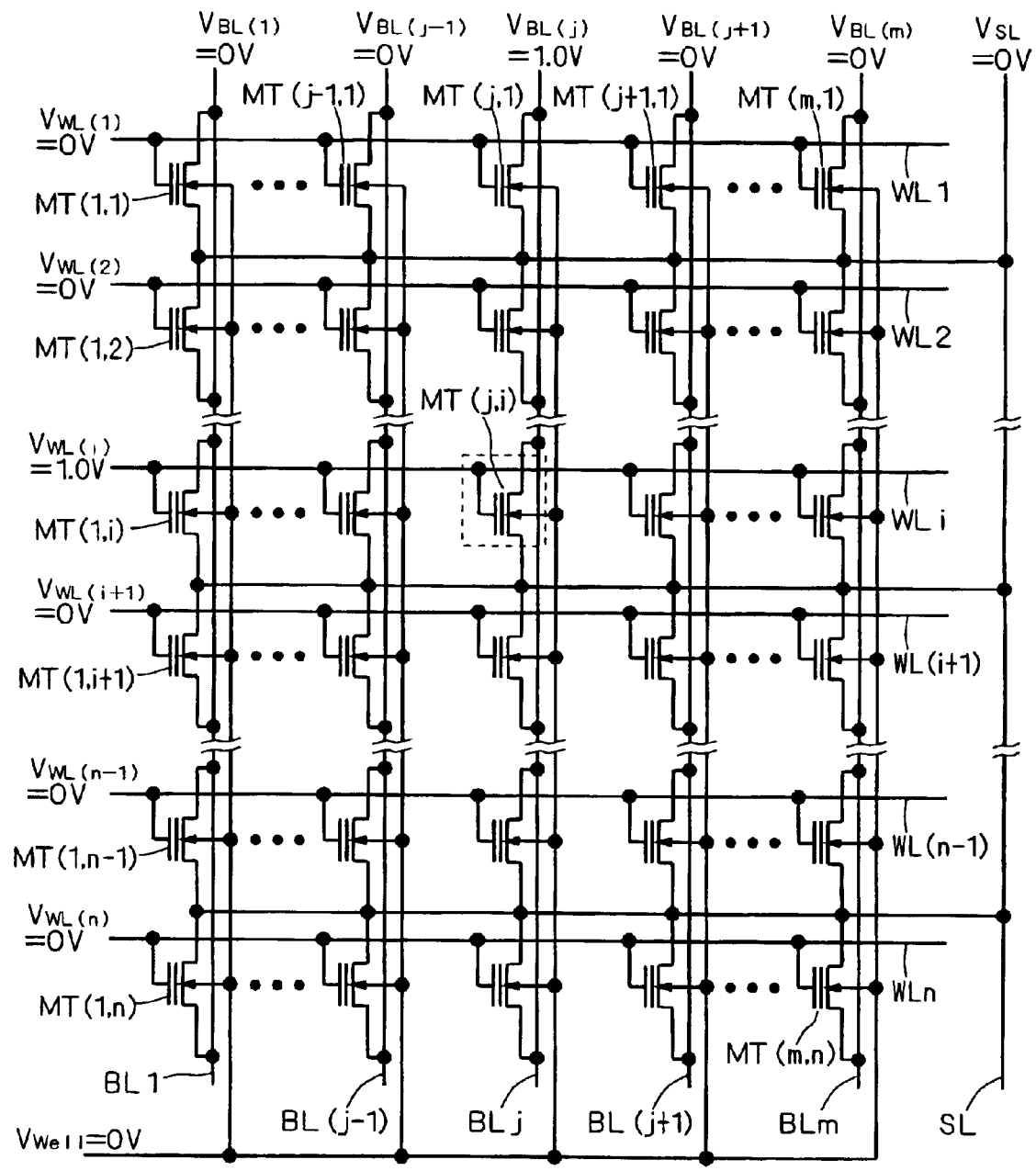
FIG. 15 is a circuit diagram showing the memory cell block for explaining the applied voltage in a state in which overerase verify is carried out at a step SP60.

FIG. 15 is a circuit diagram showing the memory cell block for explaining the applied voltage in a state in which the overerase verify is carried out at the step SP60. At the step SP60, a pulse voltage of $V_{BL(j)}$=1.0 V is applied to a bit line BLj connected to a memory cell transistor MT (j, i)

corresponding to a selection bit, both the electric potential $V_{Well}$ of the well and the electric potential $V_{SL}$ of the source line SL are set to be 0 V, and a pulse voltage of $V_{WL(i)}=1.0$ V is applied to a word line WLi connected to the memory cell transistor MT (j, i) corresponding to the selection bit.

Figure 5:
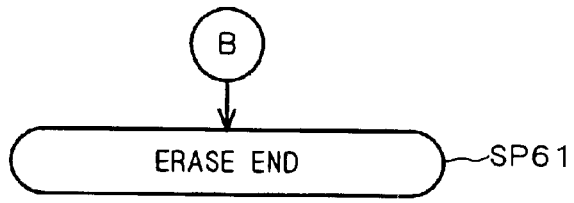
Figure 6:
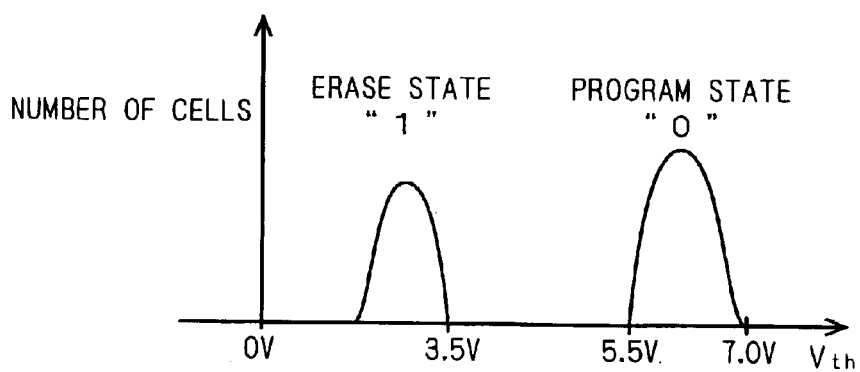
FIG. 6 is a chart showing a distribution of a threshold voltage in an initial state at time of data erase.

With reference to FIG. 3, if there is no memory cell transistor set in the overerase state, that is, a result of the decision in the step SP60 is "PASS", the process proceeds to a step SP61 shown in FIG. 5 and the first data erasing operation is ended.

Figure 4:
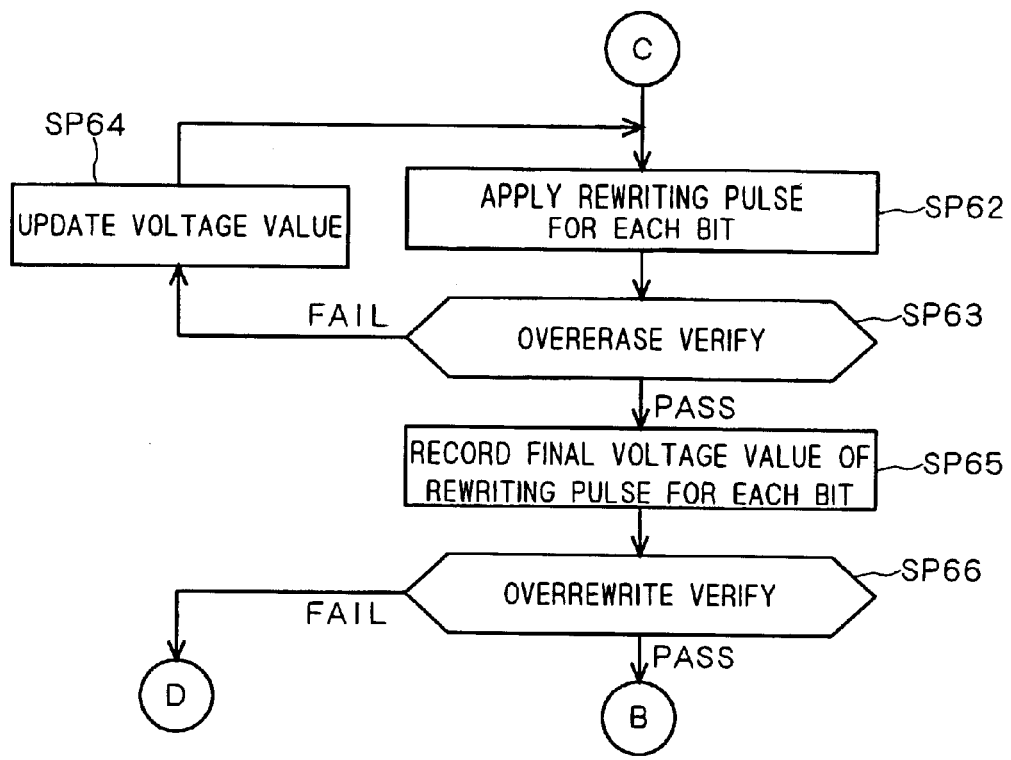

On the other hand, if there is at least one memory cell set in the overerase state, that is, the result of the decision in the step SP60 is "FAIL", the process proceeds to a step SP62 shown in FIG. 4 in which a rewriting pulse for each bit having a predetermined pulse width (which is set to be 1 μs) is applied by selecting the memory cell transistor set in the overerase state. Consequently, data are rewritten for each bit by using a channel hot electron (CHE).

FIG. 16 is a circuit diagram showing the memory cell block for explaining the applied voltage in a state in which the rewriting pulse for each bit is applied at the step SP62. At the step SP62, a pulse voltage of $V_{BL(j)}=4.0$ V is applied to a bit line BLj connected to a memory cell transistor MT (j, i) corresponding to a selection bit, all of the electric potential $V_{BL}$ of other bit lines, the electric potential $V_{Well}$ of the well and the electric potential $V_{SL}$ of the source line SL are set to be 0 V, and a pulse voltage of $V_{WL(i)}=1.0$ V is applied to a word line WLi connected to the memory cell transistor MT (j, i) corresponding to the selection bit.

With reference to FIG. 4, the overerase verify is carried out again in order to decide whether or not all the memory cell transistors set in the overerase state are recovered from the overerase state at a step SP63 subsequently to the step SP62. The conditions of the applied voltage in the step SP63 are the same as those in the step SP60.

If at least one memory cell transistor set in the overerase state is still present, that is, a result of the decision in the step SP63 is "FAIL", the voltage value of the rewriting pulse for each bit is updated to increase a pulse intensity at a step SP64. Then, a rewriting pulse for each bit having the voltage value updated is applied again to the memory cell transistor set in the overerase state at the step SP62. The operations of the steps SP62 to SP64 are repeated until the presence of the memory cell transistor set in the overerase state is eliminated, that is, the result of the decision in the step SP63 is obtained as "PASS".

Figure 17:
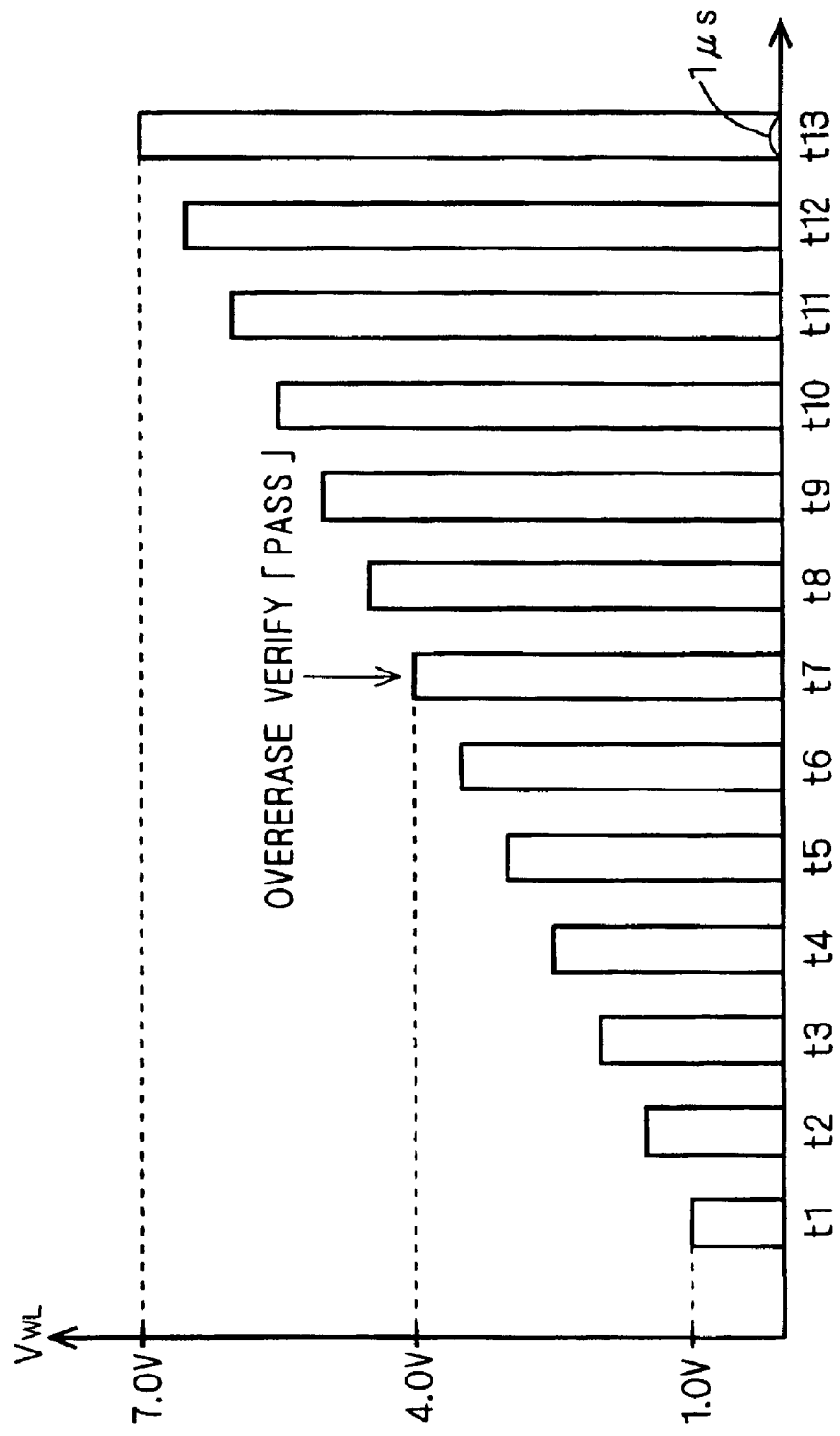
FIG. 17 is a chart showing an update status of a voltage value of the rewriting pulse for each bit at a step SP64.

FIG. 17 is a chart showing an update status of the voltage value of the rewriting pulse for each bit in the step SP64. The voltage value $V_{WL}$ of the pulse voltage applied to the word line WL is raised from 1.0 V in a first step t1 shown in FIG. 16 to 7.0 V in a thirteenth step t13 every 0.5 V. The voltage value of the pulse voltage applied to the bit line BLj connected to the memory cell transistor MT (j, i) corresponding to a selection bit is fixed to $V_{BL(j)}=4.0$ V.

With reference to FIG. 4, if the result of the decision in the step SP63 is "PASS", the process proceeds to a step SP65 in which a final voltage value of the rewriting pulse for each bit, that is, a final value $V_{WL}$ is recorded in the storage portion 2a shown in FIG. 1. As shown in an example of FIG. 17, if the result of the decision in the step SP63 is obtained as "PASS" in a seventh step t7, information of "rewriting pulse for each bit: $V_{WL}=4.0$ V" is recorded in the storage portion 2a.

At a step SP66, next, overrewrite verify is carried out to decide whether or not there is a memory cell transistor set in an overrewrite state by excessive data rewrite. If there is no memory cell transistor set in the overrewrite state, that is, a result of the decision in the step SP66 is "PASS", the process proceeds to the step SP61 shown in FIG. 5 and the first data erasing operation is ended.

If at least one memory cell transistor set in the overrewrite state is present, that is, the result of the decision in the step SP66 is "FAIL", the process returns to the step SP56 shown in FIG. 3 and the operations at and after the step SP56 are executed again.

Figure 18:
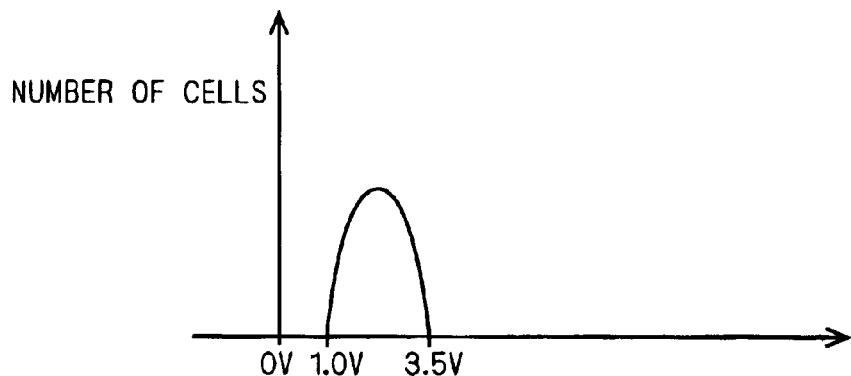
FIG. 18 is a chart showing a distribution of the threshold voltage obtained at time of a decision of "PASS" in a step SP66.

FIG. 18 is a chart showing a distribution of a threshold voltage obtained at time of the decision of "PASS" in the step SP66. At this time, the threshold voltages of all the memory cell transistors in the memory cell block are set to be equal to or higher than 1.0V and lower than 3.5 V.

Figure 19:
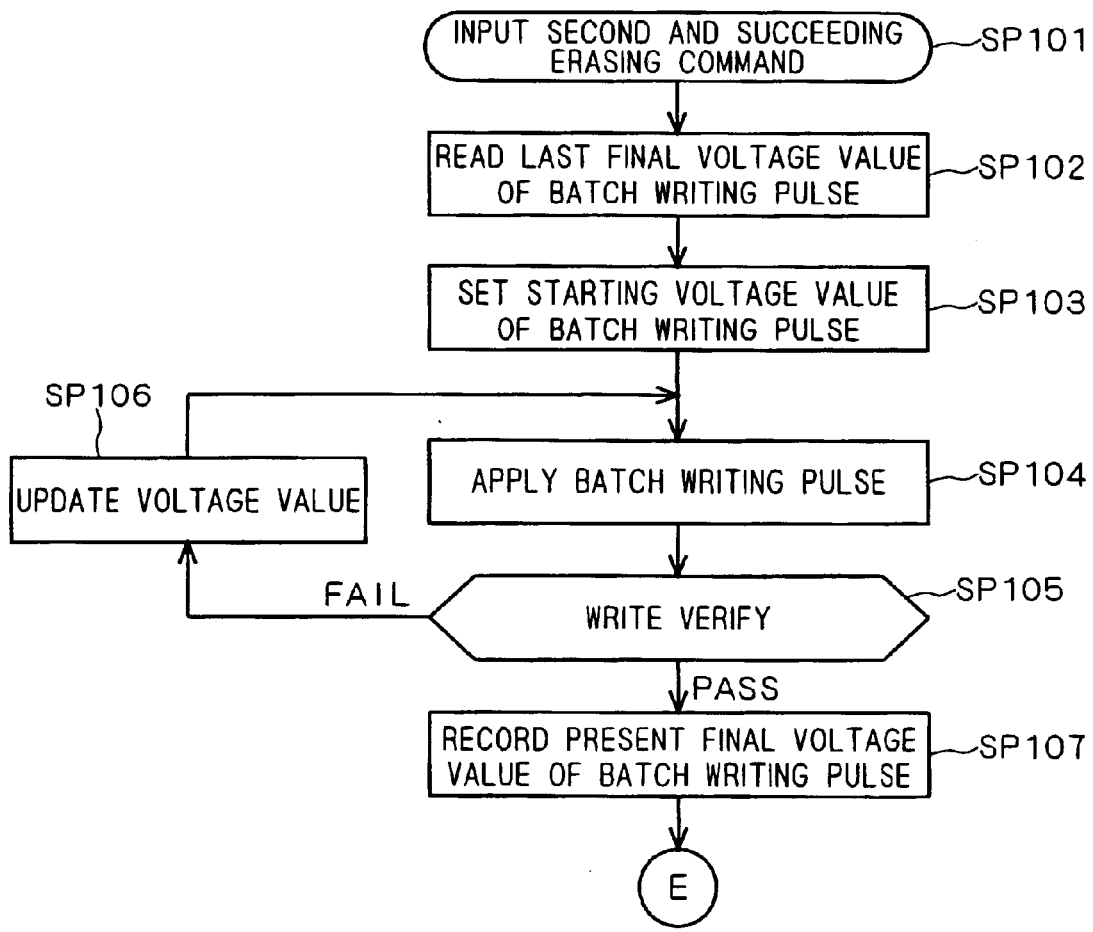
FIGS. 19 to 22 are flow charts for explaining second and succeeding data erasing methods in the nonvolatile semiconductor storage device according to the first embodiment of the present invention.

FIGS. 19 to 22 are flow charts for explaining second and succeeding data erasing methods in the nonvolatile semiconductor storage device 1 according to the first embodiment. With reference to FIG. 19, when second and succeeding erasing commands are input at a step SP101, a final voltage value of a batch writing pulse in a last data erasing operation is read from the storage portion 2a shown in FIG. 1 at a step SP102.

At a step SP103, next, the control portion 2 sets a starting voltage value of a batch writing pulse in a present data erasing operation based on the final voltage value of the batch writing pulse in a last data erasing operation. At this time, it is desirable that a value which is lower than a final pulse intensity of the batch writing pulse in the last data erasing operation by a predetermined step (for example, one or two steps) should be set in order to avoid such a situation that the pulse intensity of the batch writing pulse is too high. In the example described above, the final voltage value of the batch writing pulse in the first data erasing operation is set to $V_{WL}=8.00$ V and $V_{Well}=V_{SL}=-6.00$ V. Therefore, the starting voltage value of the batch writing pulse is set to $V_{WL}=7.75$ V and $V_{Well}=V_{SL}=-5.75$ V with a reduction of one step in a second data erasing operation. A pulse width of the batch writing pulse is the same as that obtained at a last time (1 ms).

At a step SP104, next, the batch writing pulse having the voltage value set at the step SP103 is applied to all the memory cell transistors. Then, write verify is carried out at a step SP105. Voltage application conditions in the write verify at the step SP105 are the same as the voltage application conditions in the write verify at the step SP53.

If a result of the decision in the step SP105 is "FAIL", the process proceeds to a step SP106 in which the voltage value of the batch writing pulse is updated in accordance with FIG. 9 such that the pulse intensity is increased. Thereafter, the batch writing pulse having the voltage value updated is applied again at the step SP104. The operations of the steps SP104 to SP106 are repeated until the result of the decision in the step SP105 is obtained as "PASS".

If the result of the decision in the step SP105 is "PASS", the process proceeds to a step SP107 in which a final voltage value of the batch writing pulse for the present data erasing operation is recorded in the storage portion 2a shown in FIG. 1. The final voltage value of the batch writing pulse for the present data erasing operation is utilized when the control portion 2 is to set the starting voltage value of the batch writing pulse in a next data erasing operation.

Figure 20:
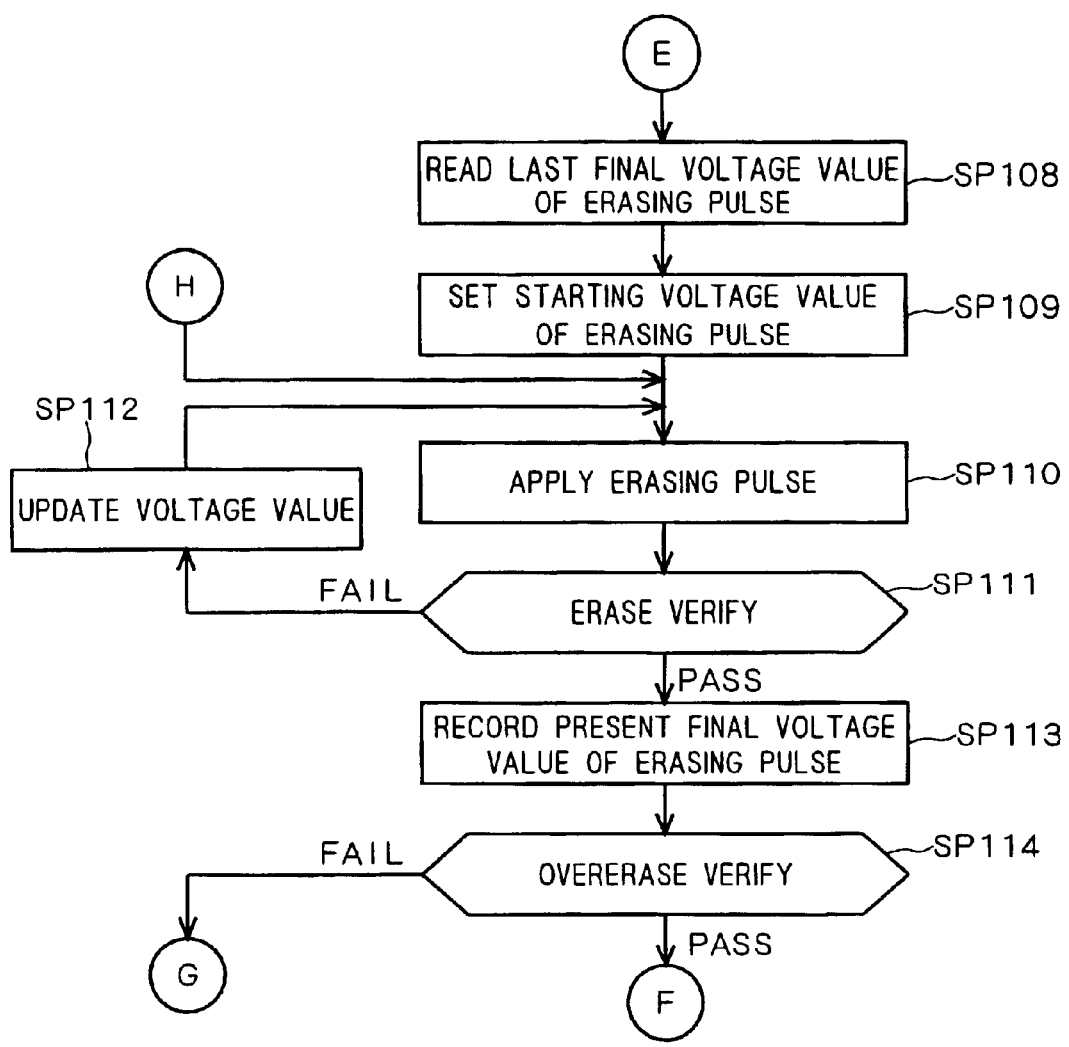

With reference to FIG. 20, next, the final voltage value of the erasing pulse in the last data erasing operation is read from the storage portion 2a shown in FIG. 1 at a step SP108. At a step SP109, then, the control portion 2 sets the starting voltage value of the erasing pulse in the present data erasing operation based on the final voltage value of the erasing pulse in the last data erasing operation. At this time, it is desirable that a value which is lower than a final pulse intensity of the erasing pulse in the last data erasing operation by a predetermined step should be set in order to avoid such a situation that the pulse intensity of the erasing pulse is too high. In the example described above, the final voltage value of the erasing pulse in the first data erasing operation is set to $V_{WL}=-7.00$ V and $V_{Well}=V_{SL}=5.00$ V. Therefore, the starting voltage value of the erasing pulse is set to $V_{WL}=-6.75$ V and $V_{Well}=V_{SL}=4.75$ V with a reduction of one step in the second data erasing operation. A pulse width of the erasing pulse is the same as that obtained at a last time (1 ms).

At a step SP110, next, the erasing pulse having the voltage value set at the step SP109 is applied to all the memory cell transistors. Then, erase verify is carried out at a step SP111. Voltage application conditions in the erase verify at the step SP111 are the same as the voltage application conditions in the erase verify at the step SP57.

If a result of the decision in the step SP111 is "FAIL", the process proceeds to a step SP112 in which the voltage value of the erasing pulse is updated in accordance with FIG. 13 such that the pulse intensity is increased. Thereafter, the erasing pulse having the voltage value updated is applied again at the step SP110. The operations of the steps SP110 to SP112 are repeated until the result of the decision in the step SP111 is obtained as "PASS".

If the result of the decision in the step SP111 is "PASS", the process proceeds to a step SP113 in which a final voltage value of the erasing pulse for the present data erasing operation is recorded in the storage portion 2a shown in FIG. 1. The final voltage value of the erasing pulse for the present data erasing operation is utilized when the control portion 2 is to set the starting voltage value of the erasing pulse in a next data erasing operation.

At a step SP114, next, overerase verify is carried out. Voltage application conditions in the overerase verify at the step SP114 are the same as the voltage application conditions in the overerase verify at the step SP60. If a result of the decision in the step SP114 is "PASS", the process proceeds to a step SP115 shown in FIG. 22 and the present data erasing operation is ended.

Figure 21:
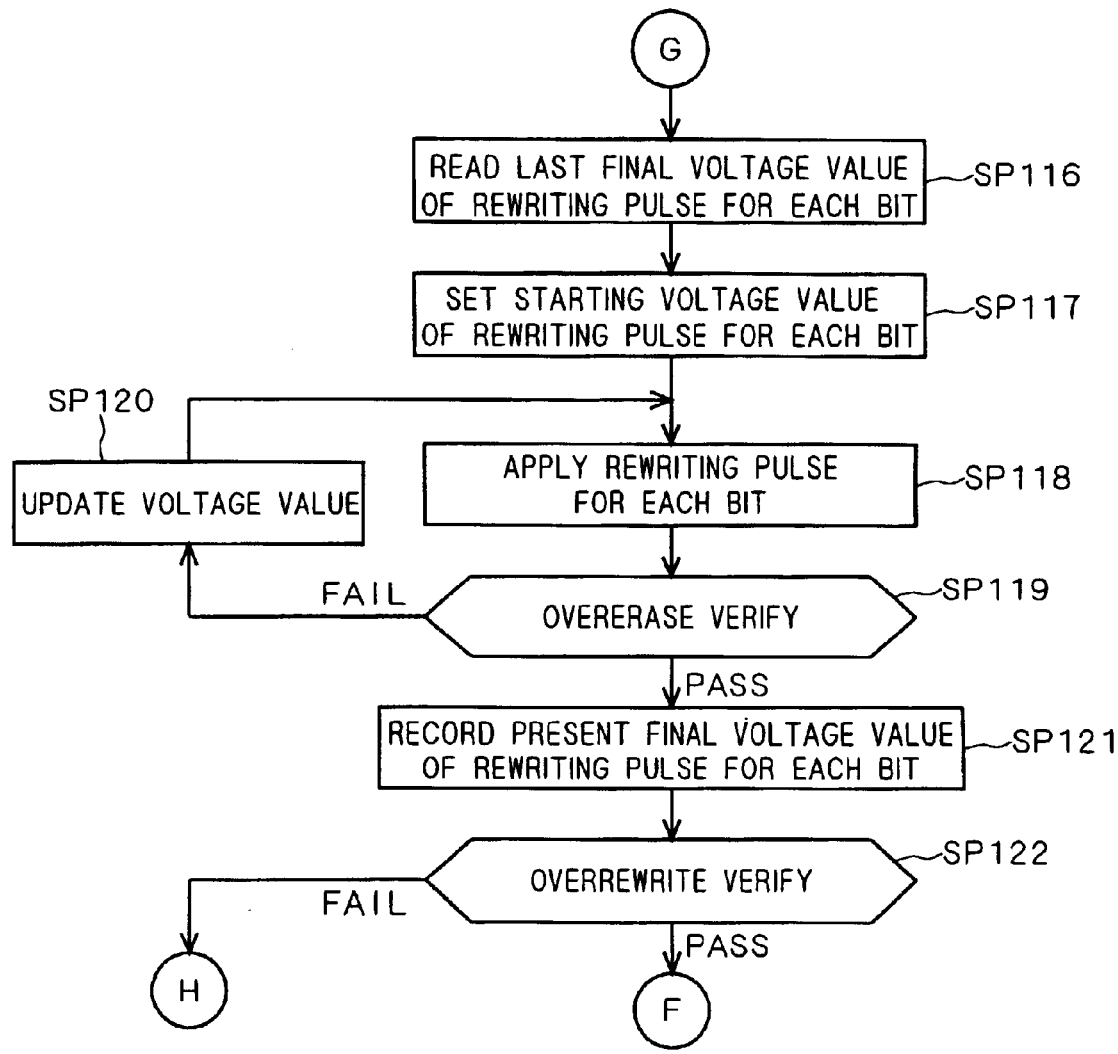
Figure 22:
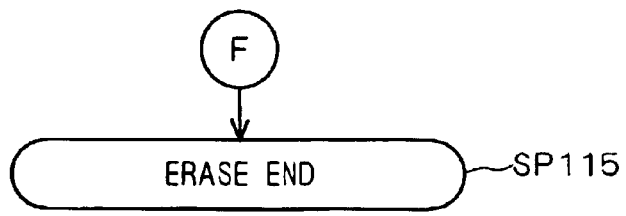

On the other hand, if the result of the decision in the step SP114 is "FAIL", the process proceeds to a step SP116 shown in FIG. 21 in which a final voltage value of a rewriting pulse for each bit in the last data erasing operation is read from the storage portion 2a shown in FIG. 1. At a step SP117, next, the control portion 2 sets a starting voltage value of a rewriting pulse for each bit in a present data erasing operation based on the final voltage value of the rewriting pulse for each bit in the last data erasing operation. At this time, it is desirable that a value which is lower than a final pulse intensity of the rewriting pulse for each bit in the last data erasing operation by a predetermined step should be set in order to avoid such a situation that the pulse intensity of the rewriting pulse for each bit is too high. In the example described above, the final voltage value of the rewriting pulse for each bit in the first data erasing operation is set to $V_{WL}=4.0$ V. Therefore, the starting voltage value of the rewriting pulse for each bit is set to $V_{WL}=3.5$ V with a reduction of one step in the second data erasing operation. A pulse width of the rewriting pulse for each bit is the same as that obtained at a last time (1 μs).

At a step SP118, next, the rewriting pulse for each bit having the voltage value set at the step SP117 is applied by selecting a memory cell transistor set in an overerase state. Then, the same overerase verify as that in the step SP114 is carried out at a step SP119.

If a result of the decision in the step SP119 is "FAIL", the process proceeds to a step SP120 in which the voltage value of the rewriting pulse for each bit is updated in accordance with FIG. 17 such that a pulse intensity is increased. Thereafter, the rewriting pulse for each bit having the voltage value updated is applied again at the step SP118. The operations of the steps SP118 to SP120 are repeated until the result of the decision in the step SP119 is obtained as "PASS".

If the result of the decision in the step SP119 is "PASS", the process proceeds to a step SP121 in which a final voltage value of the rewriting pulse for each bit in the present data erasing operation is recorded in the storage portion 2a shown in FIG. 1. The final voltage value of the rewriting pulse for each bit in the present data erasing operation is utilized when the control portion 2 is to set the starting voltage value of the rewriting pulse for each bit in a next data erasing operation.

At a step SP122, next, overrewrite verify is carried out. Voltage application conditions in the overrewrite verify at the step SP122 are the same as the voltage application conditions in the overrewrite verify at the step SP66. If a result of the decision in the step SP122 is "PASS", the process proceeds to the step SP115 shown in FIG. 22 and the present data erasing operation is ended. On the other hand, if the result of the decision in the step SP122 is "FAIL", the process returns to the step SP110 shown in FIG. 20 and the operations at and after the step SP110 are executed again.

In the above description, the control portion 2 separately reads the final voltage value at the last time of the batch writing pulse, the final voltage value at the last time of the erasing pulse and the final voltage value at the last time of the rewriting pulse for each bit in the present data erasing operation at the steps SP102, SP108 and SP116, respectively. However, each of the final voltage values at the last time of the erasing pulse and the rewriting pulse for each bit is read together when the final voltage value at the last time of the batch writing pulse is to be read at the step SP102.

According to the nonvolatile semiconductor storage device and data erasing method thereof in accordance with the first embodiment, thus, the data (first information) on the final pulse intensity of the batch writing pulse in the last data erasing operation are stored in the storage portion 2a and the control portion 2 determines the starting value of the pulse intensity of the batch writing pulse in the present data erasing operation based on the first information. Also in the data erasing operation to be carried out after a large number of data erasing operations have already been executed, accordingly, there is a lower possibility that the result of the decision in the step SP105 might be "FAIL" as compared with the conventional art. Thus, it is possible to shorten a time required for the data erasing operation.

Moreover, the data (second information) on the final pulse intensity of the erasing pulse in the last data erasing operation are stored in the storage portion 2a and the control portion 2 determines the starting value of the pulse intensity of the erasing pulse in the present data erasing operation based on the second information. Also in the data erasing operation to be carried out after a large number of data erasing operations have already been executed, accordingly, there is a lower possibility that the result of the decision in the step SP111 might be "FAIL" as compared with the conventional art. Thus, it is possible to shorten the time required for the data erasing operation.

Furthermore, the data (third information) on the final pulse intensity of the rewriting pulse for each bit in the last data erasing operation are further stored in the storage portion 2a and the control portion 2 determines the starting value of the pulse intensity of the rewriting pulse for each bit in the present data erasing operation based on the third information. Also in the data erasing operation to be carried out after a large number of data erasing operations have already been executed, accordingly, there is a lower possibility that the result of the decision in the step SP119 might be "FAIL" as compared with the conventional art. Thus, it is possible to shorten the time required for the data erasing operation.

Next, a first variant of the first embodiment will be described. While the batch writing pulse is applied in the steps SP52 and SP104 in the above description, the writing pulse for each bit may be applied.

Figure 23:
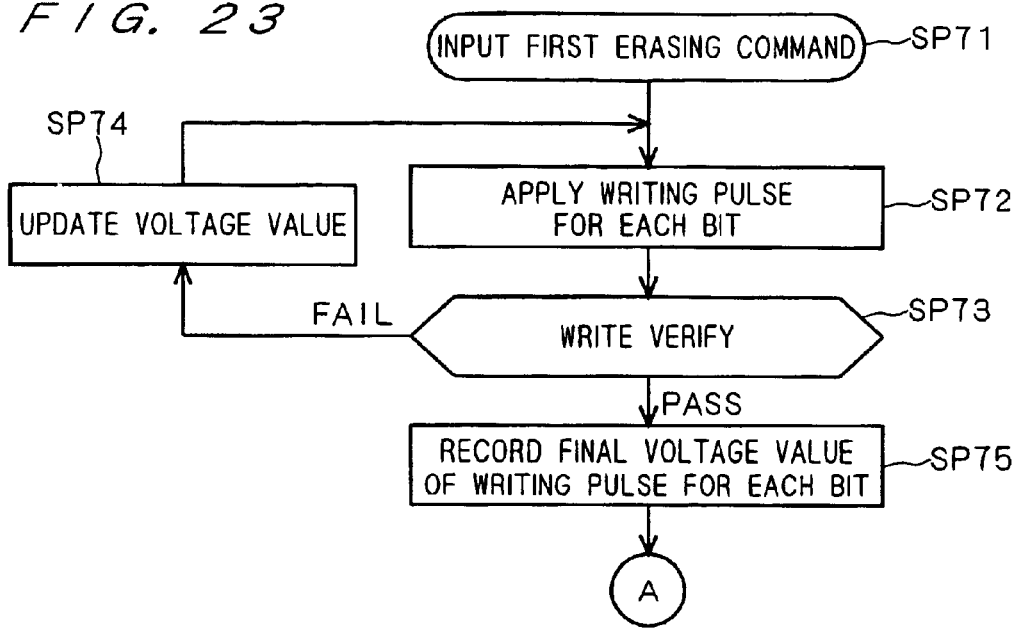
FIG. 23 is a flow chart for explaining a part of a first data erasing method in a nonvolatile semiconductor storage device according to a first variant of the first embodiment of the present invention.

FIG. 23 is a flow chart for explaining a part of the first data erasing method in the nonvolatile semiconductor storage device 1 according to the first variant of the first embodiment. When a first erasing command is input at a step SP71, a bit in an erase state is selected and a rewriting pulse for each bit is applied at a step SP72. Consequently, data are written for each bit by using a channel hot electron.

Next, write verify is carried out at a step SP73. If a result of the decision in the step SP73 is "FAIL", the process proceeds to a step SP74 in which a voltage value of a writing pulse for each bit is updated such that a pulse intensity is increased. Thereafter, the writing pulse for each bit having the voltage value updated is applied again at the step SP72. The operations of the steps SP72 to SP74 are repeated until the result of the decision in the step SP73 is obtained as "PASS".

If the result of the decision in the step SP73 is "PASS", the process proceeds to a step SP75 in which a final voltage value of the writing pulse for each bit is recorded in the storage portion 2a shown in FIG. 1. Subsequent operations are the same as those to be carried out at and after the step SP56.

Figure 24:
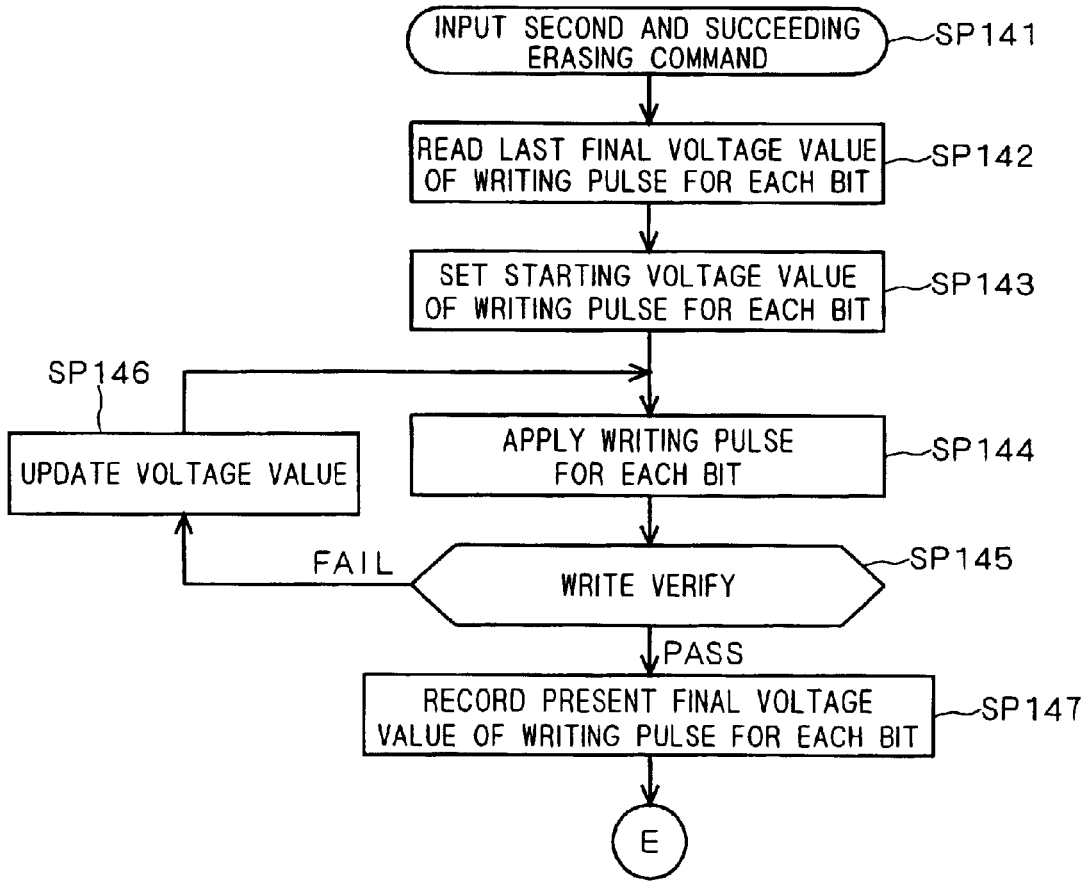
FIG. 24 is a flow chart for explaining a part of second and succeeding data erasing methods in the nonvolatile semiconductor storage device according to the first variant of the first embodiment of the present invention.

FIG. 24 is a flow chart for explaining a part of second and succeeding data erasing methods in the nonvolatile semiconductor storage device 1 according to the first variant of the first embodiment. When second and succeeding erasing commands are input at a step SP141, a final voltage value of a writing pulse for each bit in a last data erasing operation is read from the storage portion 2a shown in FIG. 1 at a step SP142.

At a step SP143, next, the control portion 2 sets a starting voltage value of a writing pulse for each bit in a present data erasing operation based on the final voltage value of the writing pulse for each bit in the last data erasing operation. At this time, it is desirable that a value which is lower than a final pulse intensity of the writing pulse for each bit in the last data erasing operation by a predetermined step should be set in order to avoid such a situation that the pulse intensity of the writing pulse for each bit is too high.

At a step SP144, next, the writing pulse for each bit having the voltage value set at the step SP143 is applied to a selected memory cell transistor. Then, write verify is carried out at a step SP145. If a result of the decision in the step SP145 is "FAIL", the process proceeds to a step SP146 in which the voltage value of the writing pulse for each bit is updated such that a pulse intensity is increased. Thereafter, the writing pulse for each bit having the voltage value updated is applied again at the step SP144. The operations of the steps SP144 to SP146 are repeated until the result of the decision in the step SP145 is obtained as "PASS".

If the result of the decision in the step SP145 is "PASS", the process proceeds to a step SP147 in which a final voltage value of the writing pulse for each bit in the present data erasing operation is recorded in the storage portion 2a shown in FIG. 1. Subsequent operations are the same as those to be carried out at and after the step SP108.

Next, a second variant of the first embodiment will be described. While the rewriting pulse for each bit is applied in the steps SP62 and SP118 in the above description, a batch rewriting pulse may be applied.

FIG. 25 is a flow chart for explaining a part of a first data erasing method in a nonvolatile semiconductor storage device 1 according to a second variant of the first embodiment. If the result of the decision in the step SP60 shown in FIG. 3 is "FAIL", a batch rewriting pulse is applied to all the memory cell transistors in a step SP80. Consequently, data are rewritten in all the memory cell transistors by using an FN tunnel current.

Next, overerase verify is carried out at a step SP81. If a result of the decision in the step SP81 is "FAIL", a voltage value of a batch rewriting pulse is updated such that a pulse intensity is increased at a step SP82. Thereafter, the batch rewriting pulse having the voltage value updated is applied again at the step SP80. The operations of the steps SP80 to SP82 are repeated until the result of the decision in the step SP81 is obtained as "PASS".

FIG. 26 is a chart showing an update status of the voltage value of the batch rewriting pulse in the step SP82. A voltage value $V_{WL}$ of a pulse voltage applied to a word line WL is raised from 5.0 V in a first step t1 to 10.0 V in an eleventh step t11 every 0.5 V. A pulse voltage of $V_{BL}$=4.0 V is applied to bit lines BL1 to BLm and both an electric potential $V_{Well}$ of a well and an electric potential $V_{SL}$ of a source line SL are set to be 0 V.

If the result of the decision in the step SP81 is "PASS", the process proceeds to a step SP83 in which a final voltage value of the batch rewriting pulse is recorded in the storage portion 2a shown in FIG. 1. Subsequent operations are the same as those to be carried out at and after the step SP66.

Figure 27:
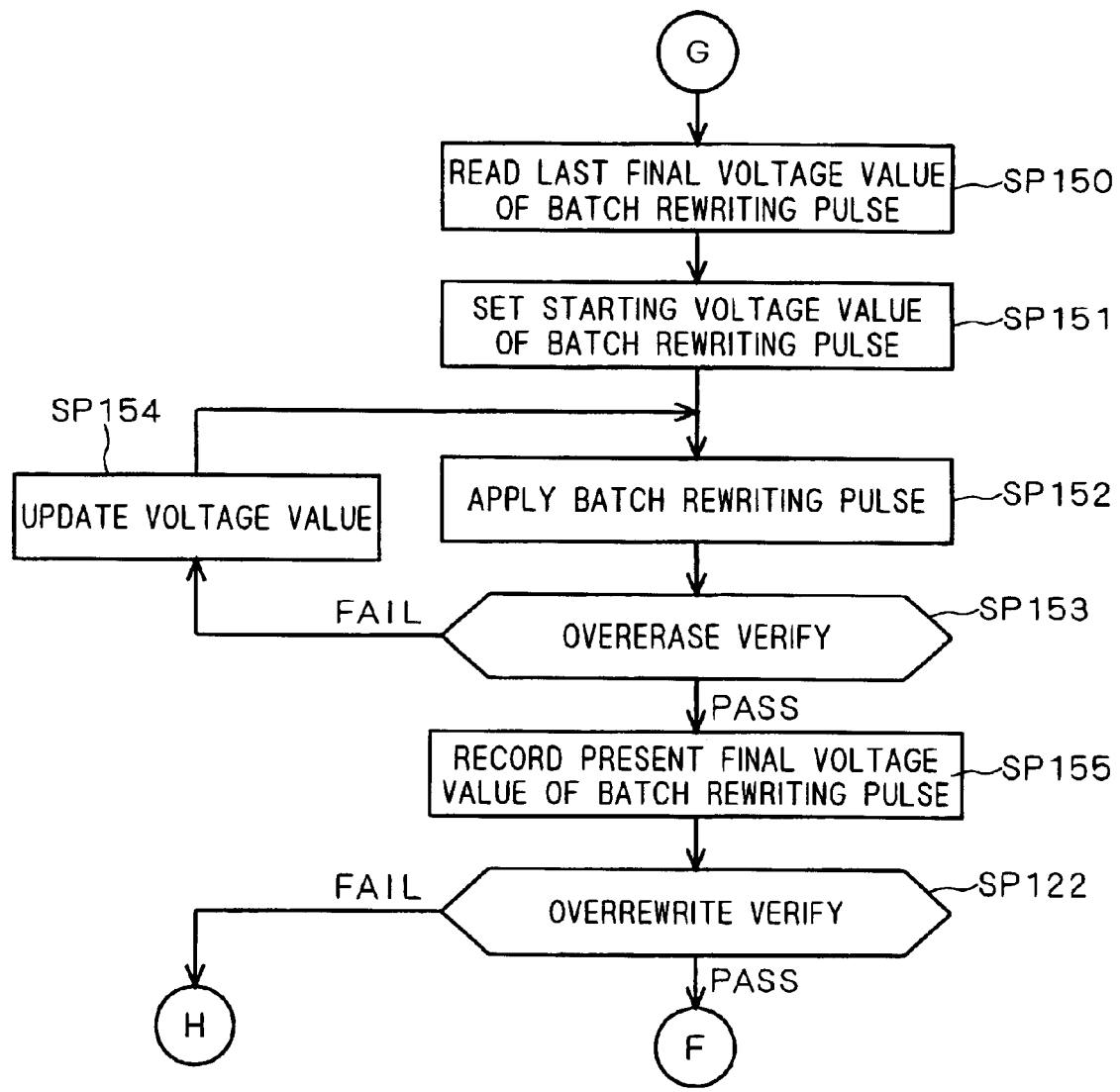
FIG. 27 is a flow chart for explaining a part of second and succeeding data erasing methods in the nonvolatile semiconductor storage device according to the second variant of the first embodiment of the present invention.

FIG. 27 is a flow chart for explaining a part of second and succeeding data erasing methods in the nonvolatile semiconductor storage device 1 according to the second variant of the first embodiment. If a result of the decision in the step SP114 shown in FIG. 20 is "FAIL", the process proceeds to a step SP150 in which a final voltage value of the batch rewriting pulse in a last data erasing operation is read from the storage portion 2a shown in FIG. 1. At a step SP151, next, the control portion 2 sets a starting voltage value of a batch rewriting pulse in a present data erasing operation based on the final voltage value of the batch rewriting pulse in the last data erasing operation. At this time, it is desirable that a value which is lower than a final pulse intensity of the batch rewriting pulse in the last data erasing operation by a predetermined step should be set in order to avoid such a situation that the pulse intensity of the batch rewriting pulse is too high.

At a step SP152, next, the batch rewriting pulse having the voltage value set at the step SP151 is applied to all memory cell transistors. Then, overerase verify is carried out at a step SP153. If a result of the decision in the step SP153 is "FAIL", the process proceeds to a step SP154 in which the voltage value of the batch rewriting pulse is updated in accordance with FIG. 26 such that a pulse intensity is increased. Thereafter, the batch rewriting pulse having the voltage value updated is applied again at the step SP152. The operations of the steps SP152 to SP154 are repeated until the result of the decision in the step SP153 is obtained as "PASS".

If the result of the decision in the step SP153 is "PASS", the process proceeds to a step SP155 in which a final voltage value of the batch rewriting pulse in the present data erasing operation is recorded in the storage portion 2a shown in FIG. 1. Subsequent operations are the same as those to be carried out at and after the step SP122.

By the semiconductor storage device and data erasing method thereof according to the first and second variants, similarly, it is possible to obtain the same effects as those in the first embodiment.

Second Embodiment

While the voltage value of the batch writing pulse is updated at the steps SP54 and SP106, the voltage value of the erasing pulse is updated at the steps SP58 and SP112 and the voltage value of the rewriting pulse for each bit is updated at the steps SP64 and SP120 in the first embodiment, a pulse width may be updated to increase a pulse intensity.

Figure 28:
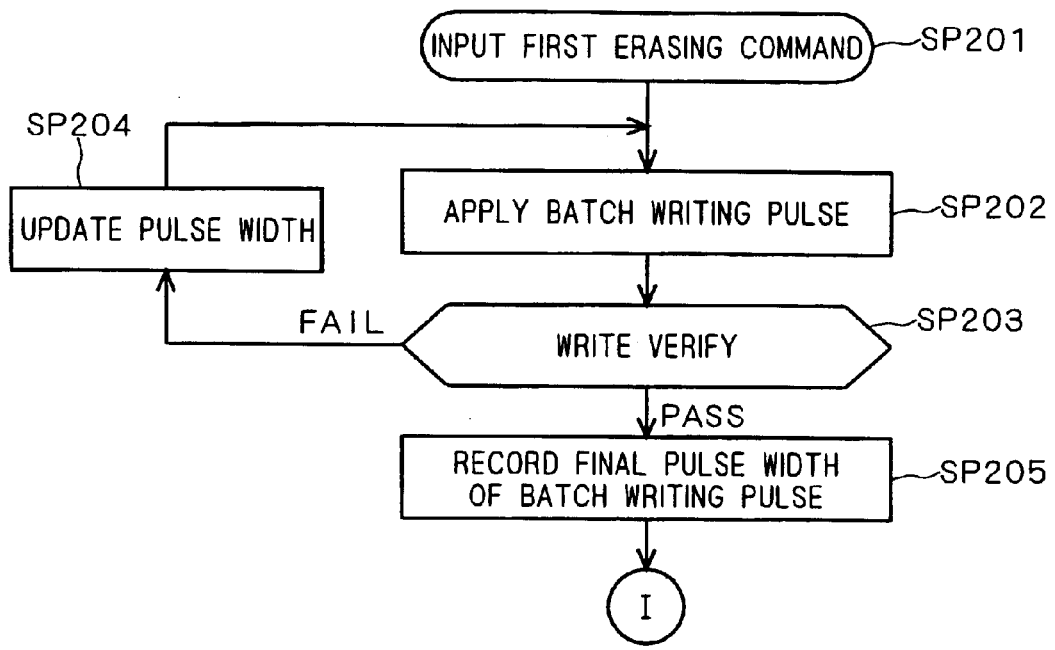
FIGS. 28 to 31 are flow charts for explaining a first data erasing method in a nonvolatile semiconductor storage device according to a second embodiment of the present invention.

FIGS. 28 to 31 are flow charts for explaining a first data erasing method in a nonvolatile semiconductor storage device 1 according to a second embodiment. With reference to FIG. 28, when a first erasing command is input at a step SP201, a batch writing pulse having a predetermined voltage value is applied to all memory cell transistors at a step SP202.

Figure 32:
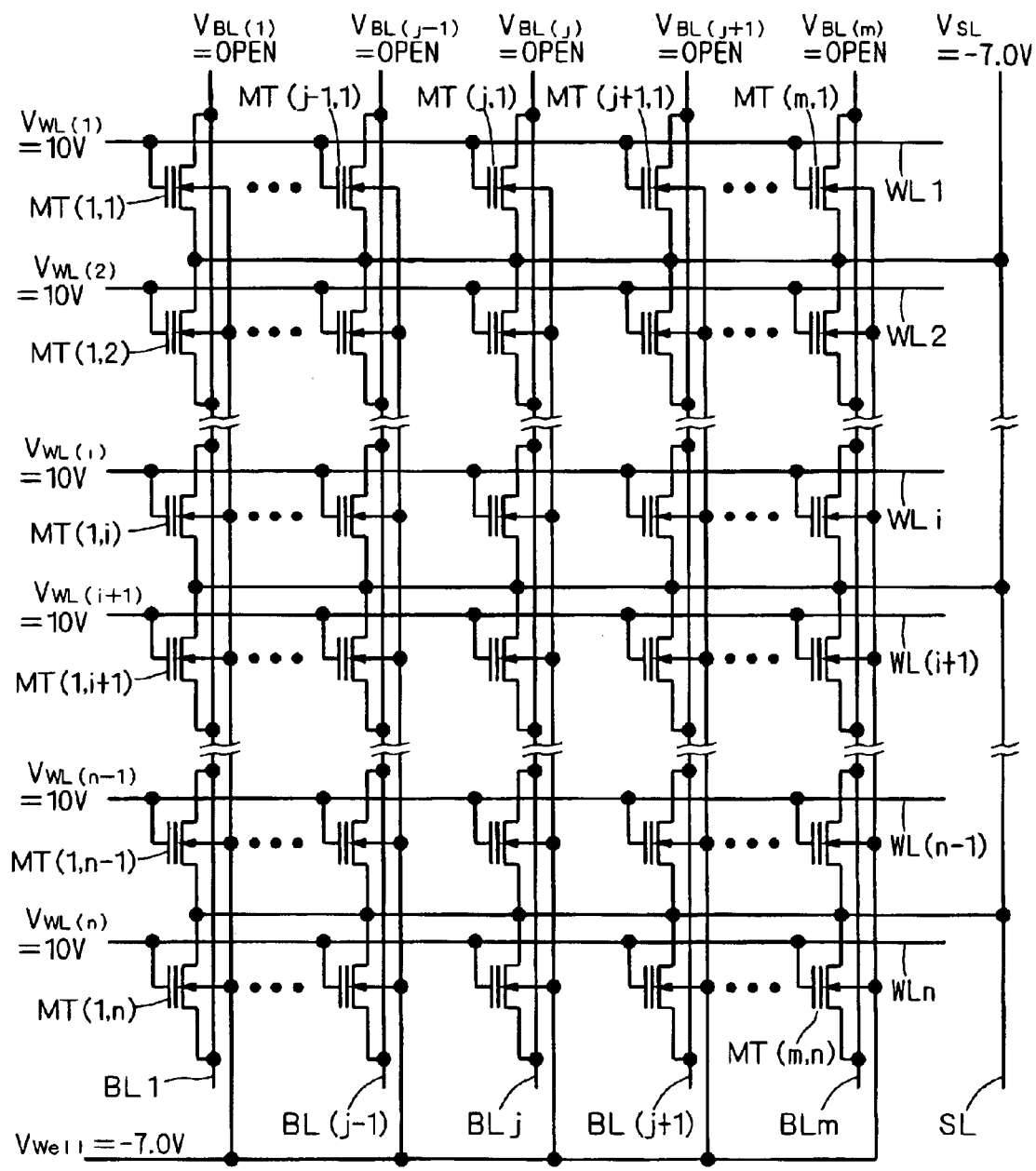
FIG. 32 is a circuit diagram showing a memory cell block for explaining an applied voltage in a state in which a batch writing pulse is applied at a step SP202.

FIG. 32 is a circuit diagram showing a memory cell block for explaining an applied voltage in a state in which a batch writing pulse is applied at the step SP202. At the step SP202, all bit lines BL1 to BLm are set to be open, a pulse voltage of $V_{Well}=-7.0$ V is applied to a well, a pulse voltage of $V_{SL}=-7.0$ V is applied to a source line SL and a pulse voltage of $V_{WL}=10$ V is applied to all word lines WL1 to WLn.

With reference to FIG. 28, write verify is carried out at a step SP203 subsequently to the step SP202. If a result of the decision in the step SP203 is "FAIL", the process proceeds to a step SP204 in which a pulse width of the batch writing pulse is updated such that a pulse intensity is increased. Then, the batch writing pulse having the pulse width updated is applied again at the step SP202. The operations of the steps SP202 to SP204 are repeated until the result of the decision in the step SP203 is obtained as "PASS".

Figure 33:
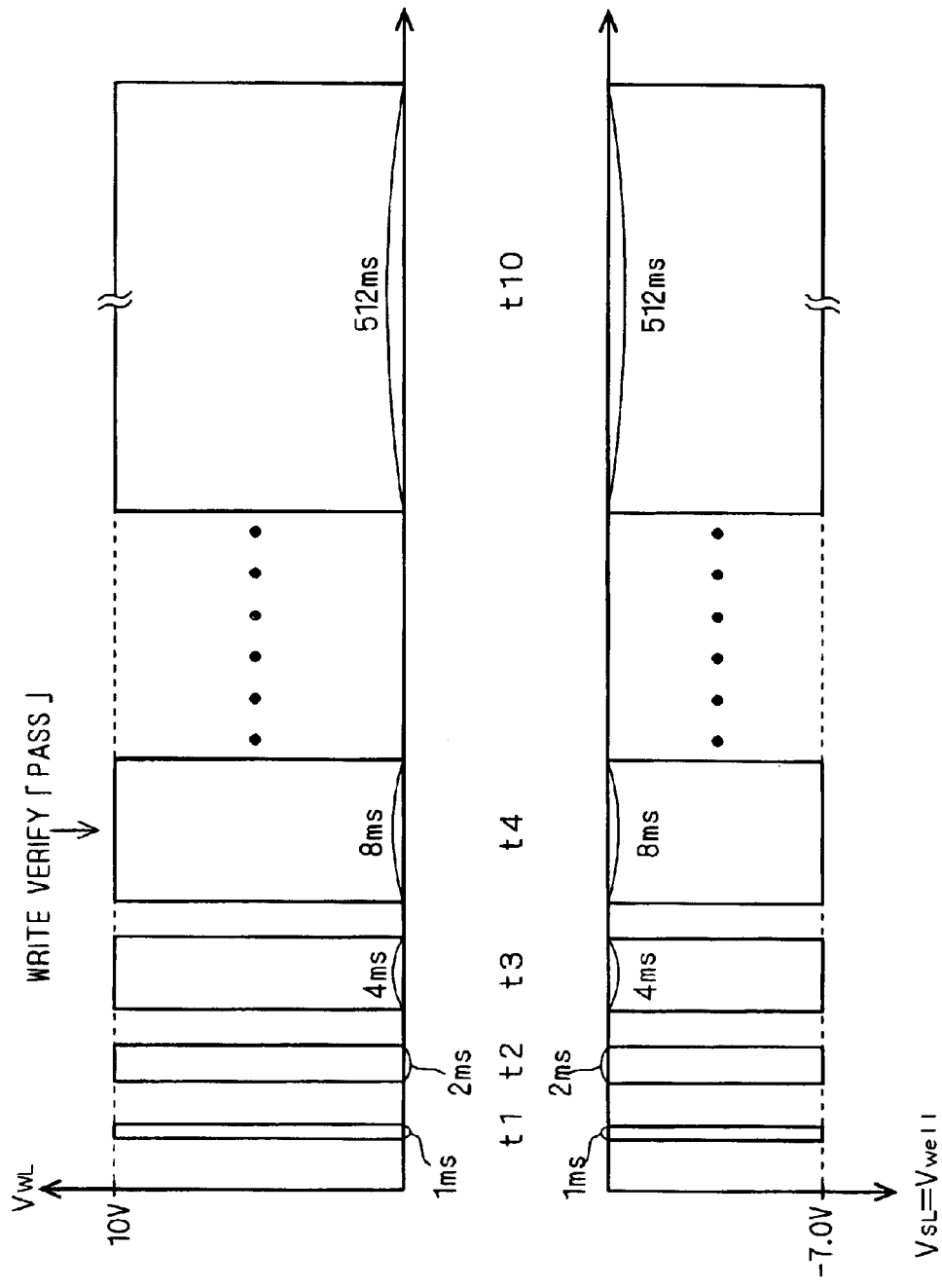
FIG. 33 is a chart showing an update status of a pulse width of the batch writing pulse at a step SP204.

FIG. 33 is a chart showing an update status of the pulse width of the batch writing pulse in the step SP204. A pulse width of a voltage pulse to be applied to each of the word line WL, the well and the source line SL is doubled every step and is thus increased from 1 ms in a first step t1 to 512 ms in a tenth step t10.

With reference to FIG. 28, if the result of the decision in the step SP203 is "PASS", the process proceeds to a step SP205 in which a final pulse width of the batch writing pulse is recorded in the storage portion 2a shown in FIG. 1. As shown in an example of FIG. 33, if the result of the decision in the step SP203 is obtained as "PASS" in a fourth step t4, information of "batch writing pulse: 8 ms" is recorded in the storage portion 2a.

Figure 29:
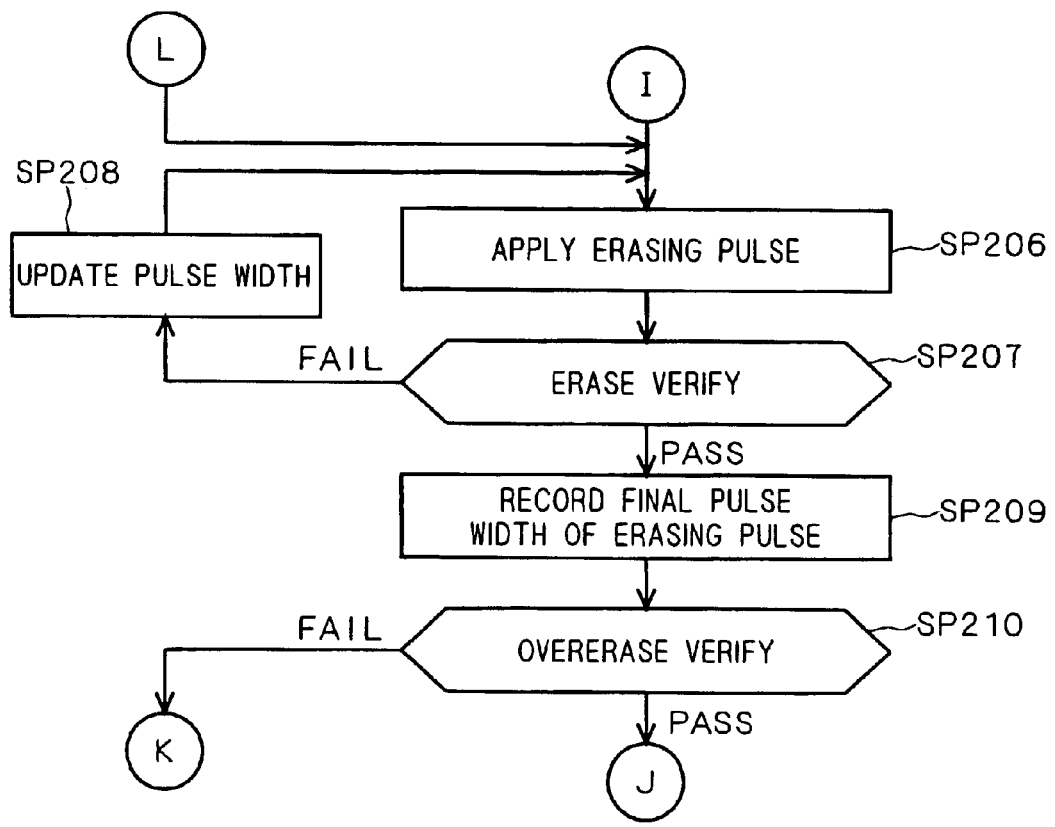

With reference to FIG. 29, an erasing pulse having a predetermined voltage value is applied to all the memory cell transistors at a step SP206 subsequently to the step SP205 shown in FIG. 28.

Figure 34:
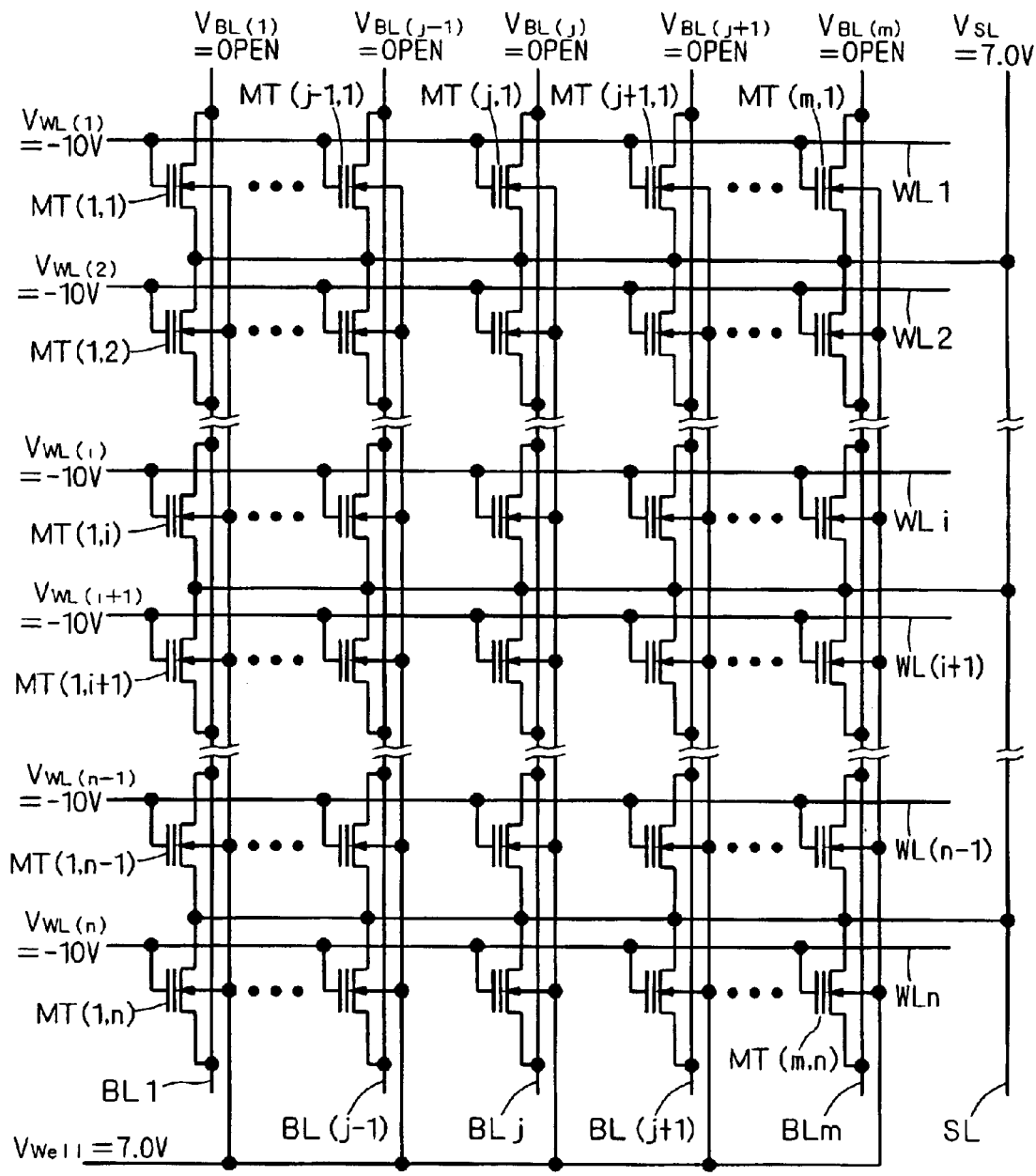
FIG. 34 is a circuit diagram showing the memory cell block for explaining the applied voltage in a state in which an erasing pulse is applied at a step SP206.

FIG. 34 is a circuit diagram showing the memory cell block for explaining the applied voltage in a state in which the erasing pulse is applied at the step SP206. At the step SP206, all the bit lines BL1 to BLm are set to be open, a pulse voltage of $V_{Well}=7.0$ V is applied to the well, a pulse voltage of $V_{SL}=7.0$ V is applied to the source line SL and a pulse voltage of $V_{WL}=-10$ V is applied to all the word lines WL1 to WLn.

With reference to FIG. 29, erase verify is carried out at a step SP207 subsequently to the step SP206. If a result of the decision in the step SP207 is "FAIL", the process proceeds to a step SP208 in which a pulse width of the erasing pulse is updated such that a pulse intensity is increased. Then, the erasing pulse having the pulse width updated is applied again at the step SP206. The operations of the steps SP206 to SP208 are repeated until the result of the decision in the step SP207 is obtained as "PASS".

Figure 35:
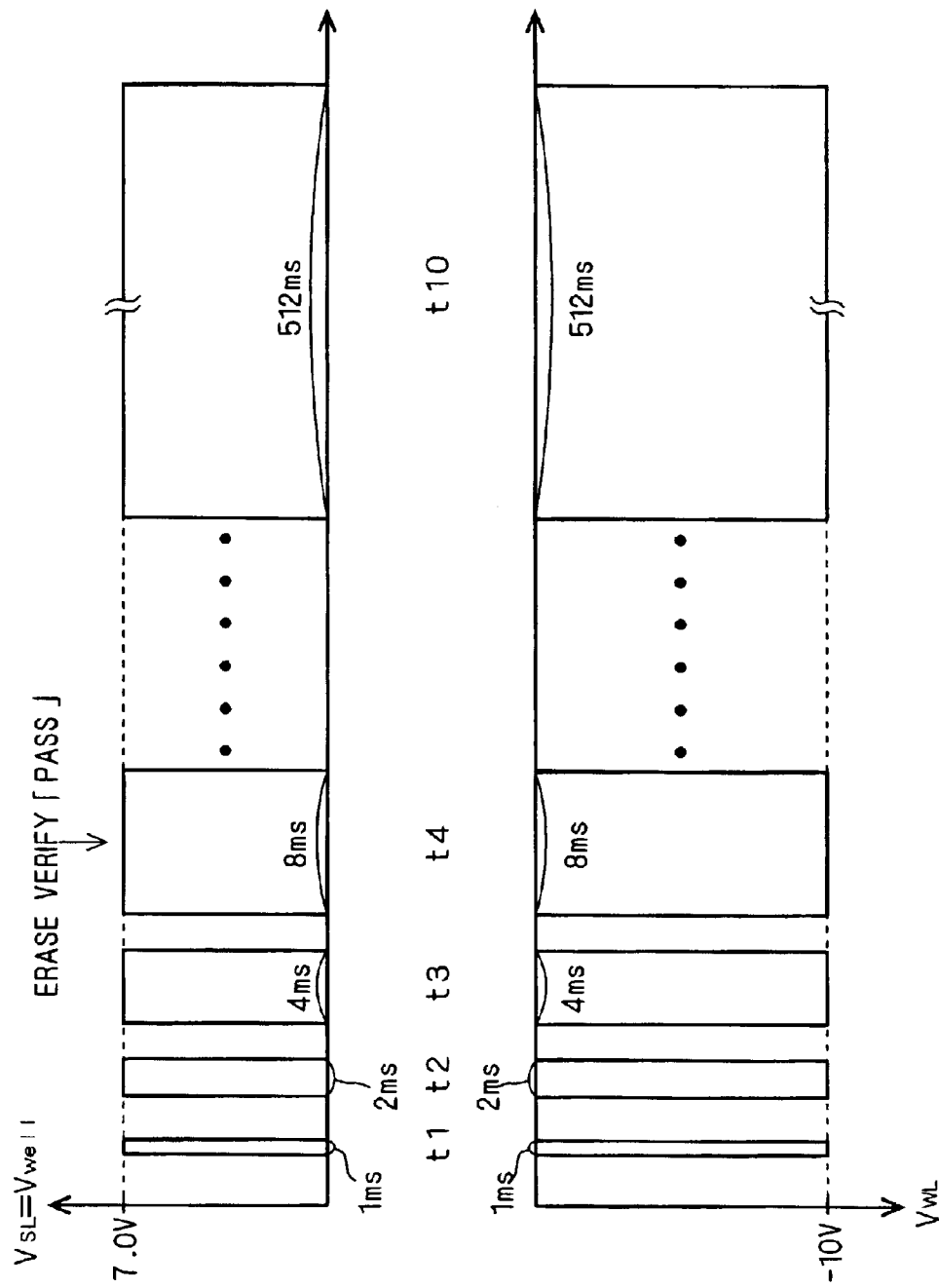
FIG. 35 is a chart showing an update status of a pulse width of the erasing pulse at a step SP208.

FIG. 35 is a chart showing an update status of the pulse width of the erasing pulse in the step SP208. A pulse width of a voltage pulse to be applied to each of the word line WL, the well and the source line SL is doubled every step and is thus increased from 1 ms in a first step t1 to 512 ms in a tenth step t10.

With reference to FIG. 29, if the result of the decision in the step SP207 is "PASS", the process proceeds to a step SP209 in which a final pulse width of the erasing pulse is recorded in the storage portion 2a shown in FIG. 1. As shown in an example of FIG. 35, if the result of the decision in the step SP207 is obtained as "PASS" in a fourth step t4, information of "erasing pulse: 8 ms" is recorded in the storage portion 2a.

Next, overerase verify is carried out at a step SP210. If a result of the decision in the step SP210 is "PASS", the process proceeds to a step SP211 shown in FIG. 31 and the first data erasing operation is ended. On the other hand, if the result of the decision in the step SP210 is "FAIL", the process proceeds to a step SP212 shown in FIG. 30 in which a rewriting pulse for each bit having a predetermined voltage value is applied by selecting a memory cell transistor set in an overerase state.

FIG. 36 is a circuit diagram showing the memory cell block for explaining the applied voltage in a state in which the rewriting pulse for each bit is applied at the step SP212. At the step SP212, a pulse voltage of $V_{BL(j)}=4.0$ V is applied to a bit line BLj connected to a memory cell transistor MT (j, i) corresponding to a selection bit, all of the electric potential $V_{BL}$ of other bit lines, the electric potential $V_{Well}$ of the well and the electric potential $V_{SL}$ of the source line SL are set to be 0 V, and a pulse voltage of $V_{WL(i)}=5.0$ V is applied to a word line WLi connected to the memory cell transistor MT (j, i) corresponding to the selection bit.

Figure 30:
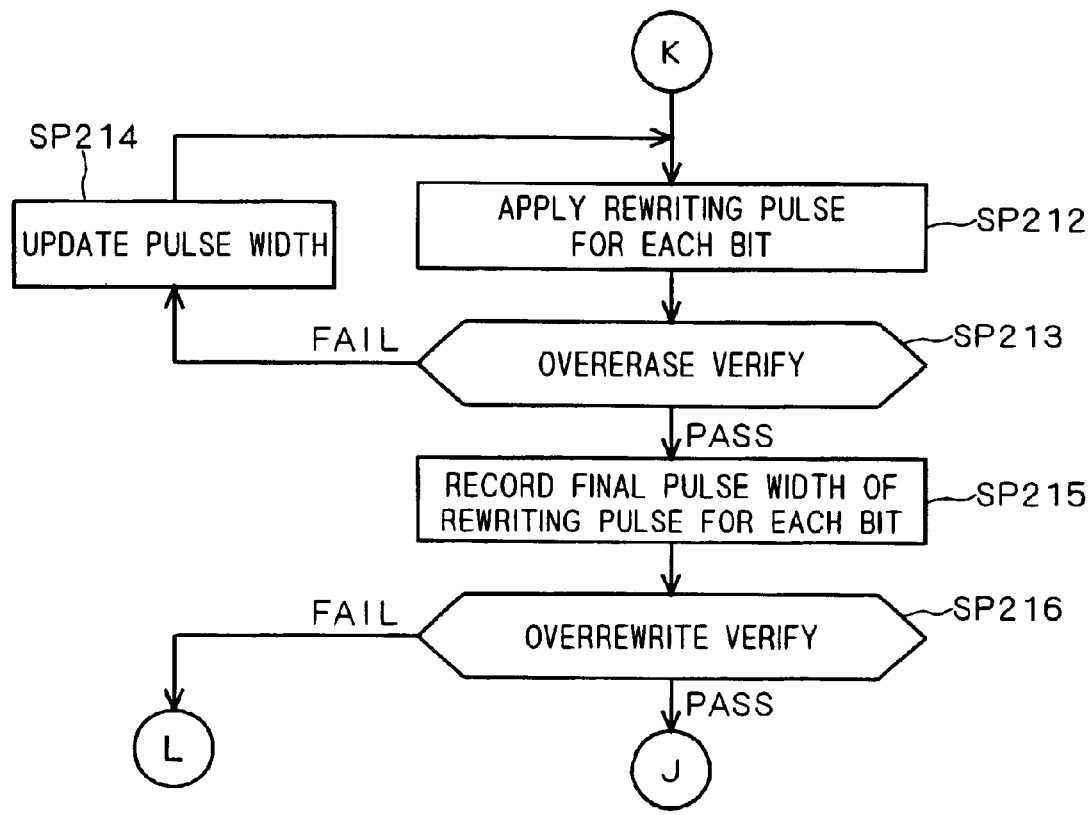
Figure 31:
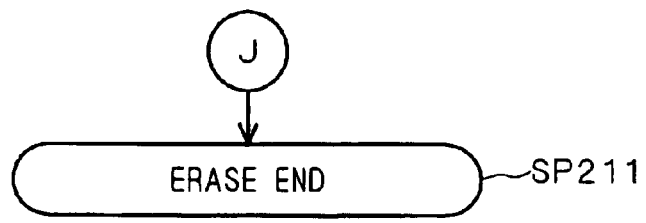

With reference to FIG. 30, overerase verify is carried out again at a step SP213 subsequently to the step SP212. If a result of the decision in the step SP213 is "FAIL", a pulse width of the rewriting pulse for each bit is updated such that a pulse intensity is increased at a step SP214. Then, the rewriting pulse for each bit having the pulse width updated is applied again to a memory cell transistor set in an overerase state at the step SP212. The operations of the steps SP212 to SP214 are repeated until the result of the decision in the step SP213 is obtained as "PASS".

Figure 37:
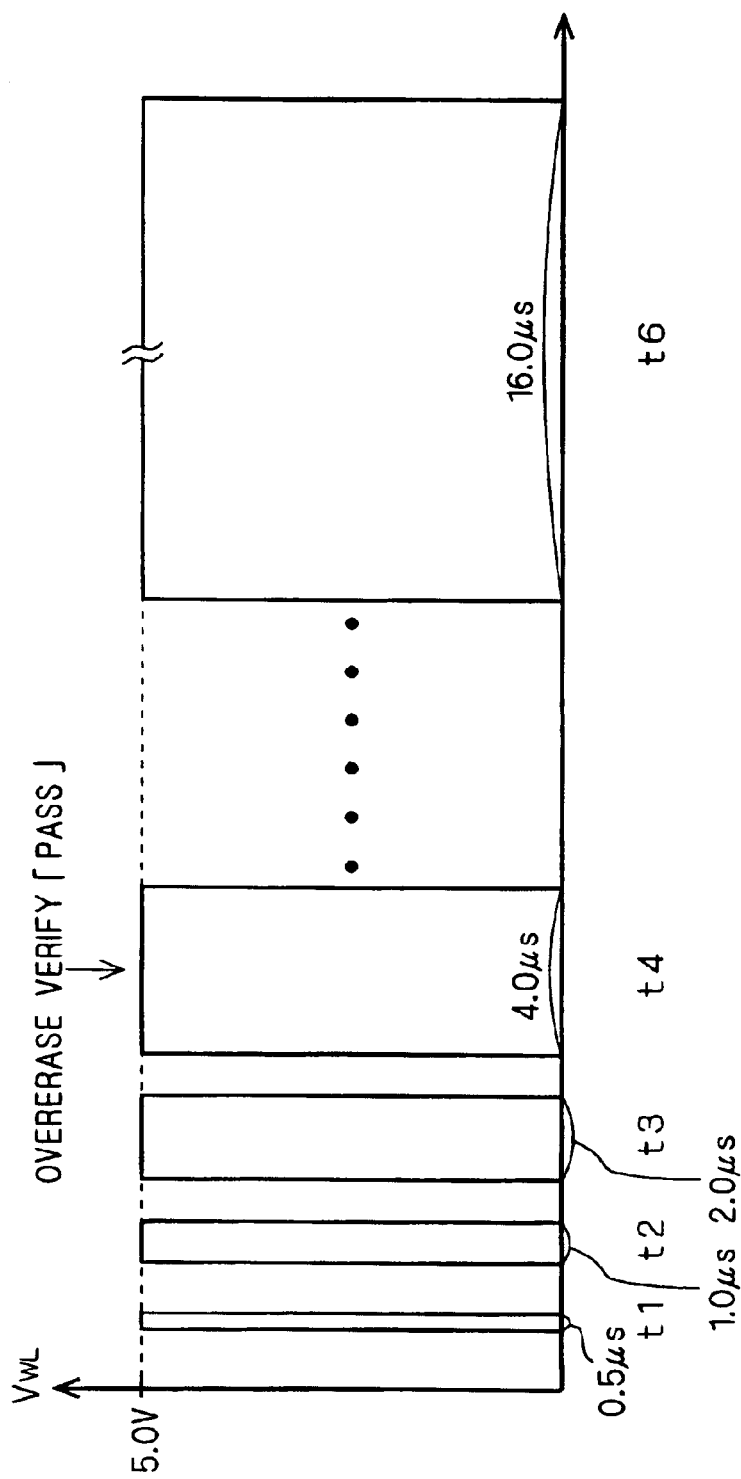
FIG. 37 is a chart showing an update status of a pulse width of a rewriting pulse for each bit at a step SP214.

FIG. 37 is a chart showing an update status of the pulse width of the rewriting pulse for each bit in the step SP214. A pulse width of a voltage pulse to be applied to the word line WL is doubled every step and is thus increased from 0.5 $\mu$s in a first step t1 to 16.0 $\mu$s in a sixth step t6.

With reference to FIG. 30, if the result of the decision in the step SP213 is "PASS", the process proceeds to a step SP215 in which a final pulse width of the rewriting pulse for each bit is recorded in the storage portion 2a shown in FIG. 1. As shown in an example of FIG. 37, if the result of the decision in the step SP213 is obtained as "PASS" in a fourth step t4, information of "rewriting pulse for each bit: 4.0 $\mu$s" is recorded in the storage portion 2a.

Next, overrewrite verify is carried out at a step SP216. If a result of the decision in the step SP216 is "PASS", the process proceeds to a step SP211 shown in FIG. 31 and the first data erasing operation is ended. On the other hand, if the result of the decision in the step SP216 is "FAIL", the process returns to the step SP206 shown in FIG. 29 and the operations at and after the step SP206 are executed again.

Figure 38:
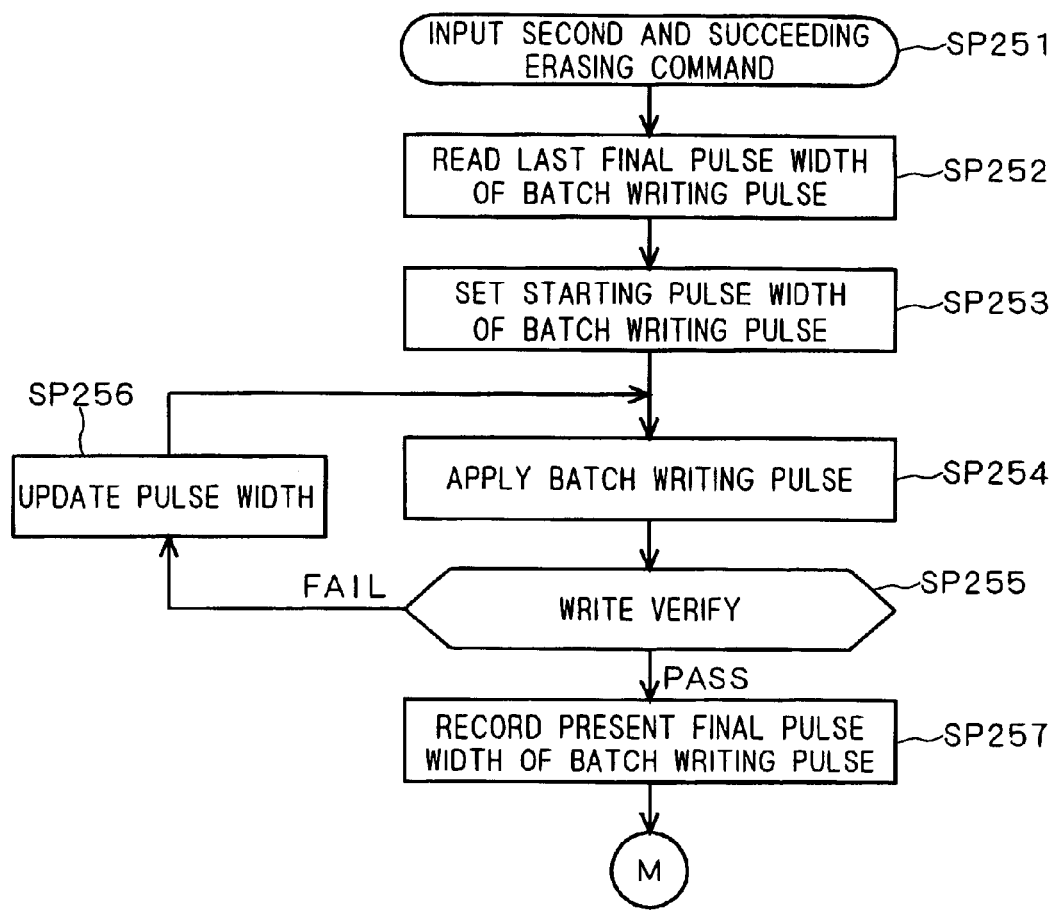
FIGS. 38 to 41 are flow charts for explaining second and succeeding data erasing methods in the nonvolatile semiconductor storage device according to the second embodiment of the present invention.

FIGS. 38 to 41 are flow charts for explaining second and succeeding data erasing methods in the nonvolatile semiconductor storage device 1 according to the second embodiment. With reference to FIG. 38, when second and succeeding erasing commands are input at a step SP251, a final pulse width of a batch writing pulse in a last data erasing operation is read from the storage portion 2a shown in FIG. 1 at a step SP252.

At a step SP253, next, a control portion 2 sets a starting pulse width of the batch writing pulse in a present data erasing operation based on the final pulse width of the batch writing pulse in the last data erasing operation. In the example described above, the final pulse width of the batch writing pulse in the first data erasing operation is 8 ms. Therefore, the starting pulse width of the batch writing pulse is set to be 4 ms with a reduction of one step in the second data erasing operation. A voltage value of the batch writing pulse is the same as that obtained at the last time.

At a step SP254, next, the batch writing pulse having the pulse width set at the step SP253 is applied to all the memory cell transistors. Then, write verify is carried out at a step SP255. If a result of the decision in the step SP255 is "FAIL", the process proceeds to a step SP256 in which the pulse width of the batch writing pulse is updated in accordance with FIG. 33 such that a pulse intensity is increased. Thereafter, the batch writing pulse having the pulse width updated is applied again at the step SP254. The operations of the steps SP254 to SP256 are repeated until the result of the decision in the step SP255 is obtained as "PASS".

If the result of the decision in the step SP255 is "PASS", the process proceeds to a step SP257 in which a final pulse width of the batch writing pulse for the present data erasing operation is recorded in the storage portion 2a shown in FIG. 1.

Figure 39:
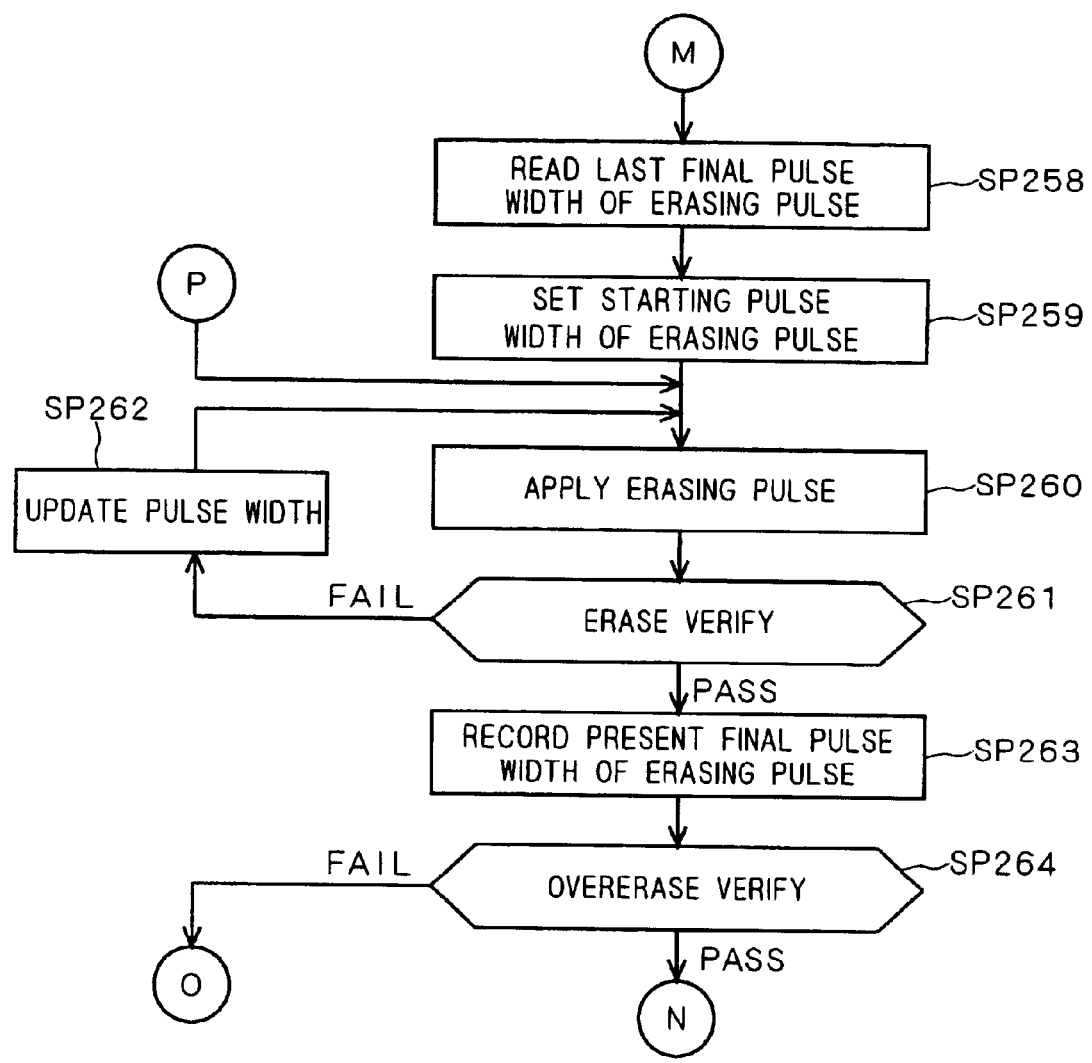
Figure 40:
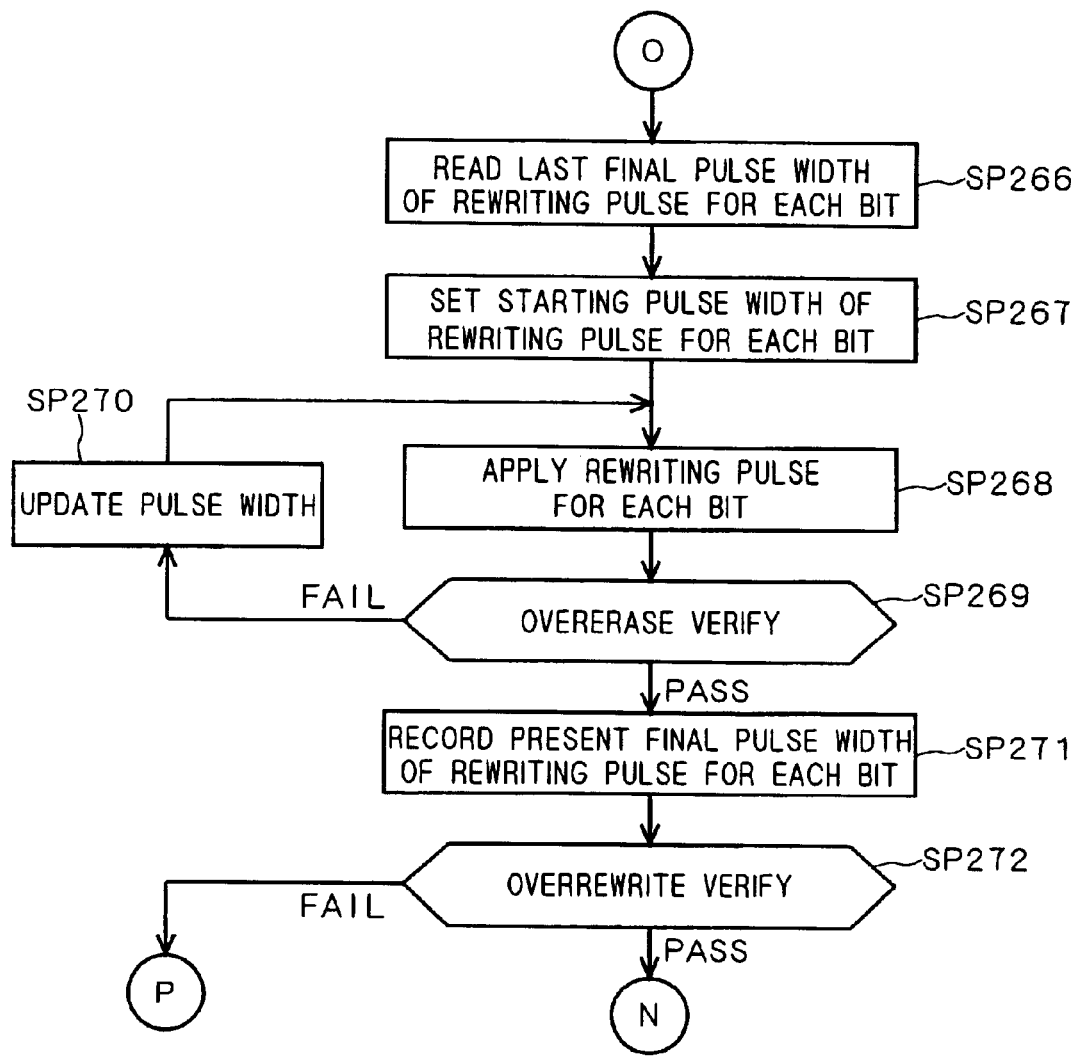
Figure 41:
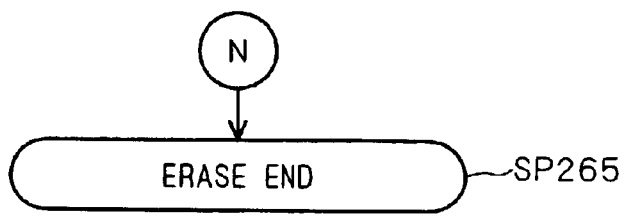

With reference to FIG. 39, next, a final pulse width of the erasing pulse in the last data erasing operation is read from the storage portion 2a shown in FIG. 1 at a step SP258. At a step SP259, then, the control portion 2 sets a starting pulse width of the erasing pulse in the present data erasing operation based on the final pulse width of the erasing pulse in the last data erasing operation. In the example described above, since the final pulse width of the erasing pulse in the first data erasing operation is 8 ms, the starting pulse width of the erasing pulse is set to be 4 ms with a reduction of one step in the second data erasing operation. A voltage value of the erasing pulse is the same as that obtained at the last time.

At a step SP260, next, the erasing pulse having the pulse width set at the step SP259 is applied to all the memory cell transistors. Then, erase verify is carried out at a step SP261. If a result of the decision in the step SP261 is "FAIL", the process proceeds to a step SP262 in which the pulse width of the erasing pulse is updated in accordance with FIG. 35 such that a pulse intensity is increased. Thereafter, the erasing pulse having the pulse width updated is applied again at the step SP260. The operations of the steps SP260 to SP262 are repeated until the result of the decision in the step SP261 is obtained as "PASS".

If the result of the decision in the step SP261 is "PASS", the process proceeds to a step SP263 in which a final pulse width of the erasing pulse for the present data erasing operation is recorded in the storage portion 2a shown in FIG. 1.

At a step SP264, next, overerase verify is carried out. If a result of the decision in the step SP264 is "PASS", the process proceeds to a step SP265 shown in FIG. 41 and the present data erasing operation is ended. On the other hand, if the result of the decision in the step SP264 is "FAIL", the process proceeds to a step SP266 shown in FIG. 40 in which a final pulse width of a rewriting pulse for each bit in the last data erasing operation is read from the storage portion 2a shown in FIG. 1.

At a step SP267, next, the control portion 2 sets a starting pulse width of a rewriting pulse for each bit in the present data erasing operation based on the final pulse width of the rewriting pulse for each bit in the last data erasing operation. In the example described above, since the final pulse width of the rewriting pulse for each bit in the first data erasing operation is 4.0 μs, the starting pulse width of the rewriting pulse for each bit is set to be 2.0 μs with a reduction of one step in the second data erasing operation. A voltage value of the rewriting pulse for each bit is the same as that obtained at the last time.

At a step SP268, next, the rewriting pulse for each bit having the pulse width set at the step SP267 is applied by selecting a memory cell transistor set in an overerase state. Then, overerase verify is carried out at a step SP269. If a result of the decision in the step SP269 is "FAIL", the process proceeds to a step SP270 in which the pulse width of the rewriting pulse for each bit is updated in accordance with FIG. 37 such that a pulse intensity is increased. Thereafter, the rewriting pulse for each bit having the pulse width updated is applied again at the step SP268. The operations of the steps SP268 to SP270 are repeated until the result of the decision in the step SP269 is obtained as "PASS".

If the result of the decision in the step SP269 is "PASS", the process proceeds to a step SP271 in which a final pulse width of the rewriting pulse for each bit in the present data erasing operation is recorded in the storage portion 2a shown in FIG. 1.

At a step SP272, next, overrewrite verify is carried out. If a result of the decision in the step SP272 is "PASS", the process proceeds to the step SP265 shown in FIG. 41 and the present data erasing operation is ended. On the other hand, if the result of the decision in the step SP272 is "FAIL", the process returns to the step SP260 shown in FIG. 39 and the operations at and after the step SP260 are executed again.

In the above description, the control portion 2 separately reads the final pulse width at the last time of the batch writing pulse, the final pulse width at the last time of the erasing pulse and the final pulse width at the last time of the rewriting pulse for each bit in the second and succeeding data erasing operations at the steps SP252, SP258 and SP266, respectively. However, each of the final pulse widths at the last time of the erasing pulse and the rewriting pulse for each bit may be read together when the final pulse width at the last time of the batch writing pulse is to be read at the step SP252.

As in the data erasing method of the semiconductor storage device according to the second embodiment, the pulse intensity can be raised by increasing the pulse width in place of the voltage value. Also in the data erasing operation to be carried out after a large number of data erasing operations have already been executed in the same manner as in the first embodiment, accordingly, there is a lower possibility that the result of each decision in the steps SP255, SP261 and SP269 might be "FAIL" as compared with the conventional art. Consequently, it is possible to shorten a time required for the data erasing operation.

Next, a first variant of the second embodiment will be described. While the batch writing pulse is applied in the steps SP202 and SP254 in the above description, the writing pulse for each bit may be applied.

Figure 42:
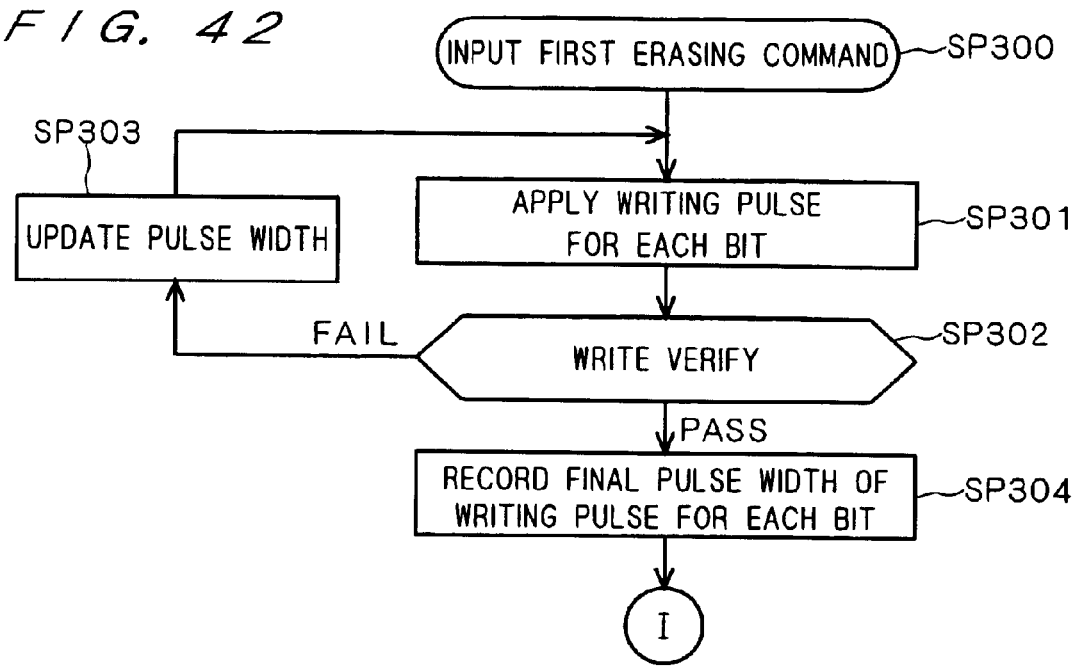
FIG. 42 is a flow chart for explaining a part of a first data erasing method in a nonvolatile semiconductor storage device according to a first variant of the second embodiment of the present invention.

FIG. 42 is a flow chart for explaining a part of a first data erasing method in a nonvolatile semiconductor storage device 1 according to the first variant of the second embodiment. When a first erasing command is input at a step SP300, a bit in an erase state is selected and a rewriting pulse for each bit is applied at a step SP301.

Next, write verify is carried out at a step SP302. If a result of the decision in the step SP302 is "FAIL", the process proceeds to a step SP303 in which a pulse width of a writing pulse for each bit is updated such that a pulse intensity is increased. Thereafter, the writing pulse for each bit having the pulse width updated is applied again at the step SP301. The operations of the steps SP301 to SP303 are repeated until the result of the decision in the step SP302 is obtained as "PASS".

If the result of the decision in the step SP302 is "PASS", the process proceeds to a step SP304 in which a final pulse width of the writing pulse for each bit is recorded in the storage portion 2a shown in FIG. 1. Subsequent operations are the same as those to be carried out at and after the step SP206.

Figure 43:
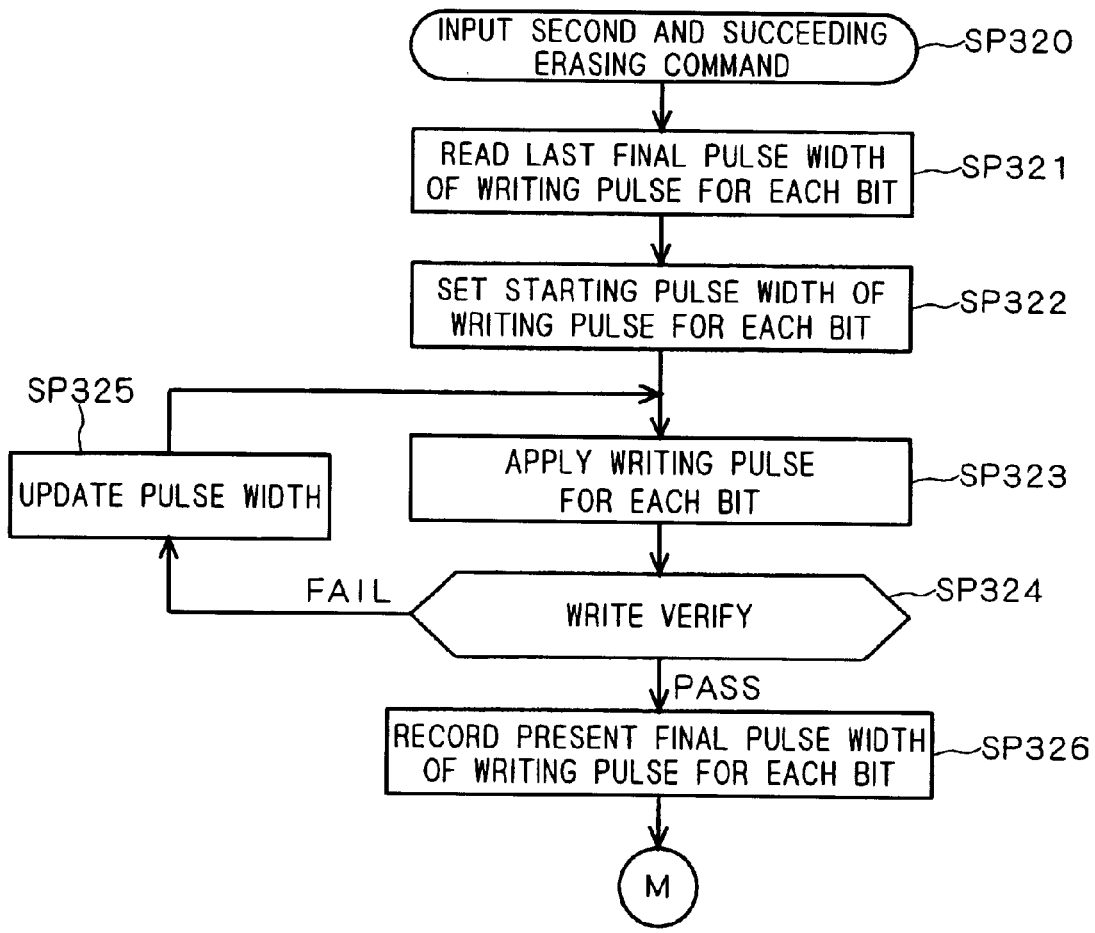
FIG. 43 is a flow chart for explaining a part of second and succeeding data erasing methods in the nonvolatile semiconductor storage device according to the first variant of the second embodiment of the present invention.

FIG. 43 is a flow chart for explaining a part of second and succeeding data erasing methods in the nonvolatile semiconductor storage device 1 according to the first variant of the second embodiment. When second and succeeding erasing commands are input at a step SP320, a final pulse width of a writing pulse for each bit in a last data erasing operation is read from the storage portion 2a shown in FIG. 1 at a step SP321.

At a step SP322, next, the control portion 2 sets a starting pulse width of a writing pulse for each bit in a present data erasing operation based on the final pulse width of the writing pulse for each bit in a last data erasing operation.

At a step SP323, next, the writing pulse for each bit having the pulse width set at the step SP322 is applied to a selected memory cell transistor. Then, write verify is carried out at a step SP324. If a result of the decision in the step SP324 is "FAIL", the process proceeds to a step SP325 in which the pulse width of the writing pulse for each bit is updated such that a pulse intensity is increased. Thereafter, the writing pulse for each bit having the pulse width updated is applied again at the step SP323. The operations of the steps SP323 to SP325 are repeated until the result of the decision in the step SP324 is obtained as "PASS".

If the result of the decision in the step SP324 is "PASS", the process proceeds to a step SP326 in which a final pulse width of the writing pulse for each bit in the present data erasing operation is recorded in the storage portion 2a shown in FIG. 1. Subsequent operations are the same as those to be carried out at and after the step SP258.

Next, a second variant of the second embodiment will be described. While the rewriting pulse for each bit is applied in the steps SP212 and SP268 in the above description, a batch rewriting pulse may be applied.

Figure 44:
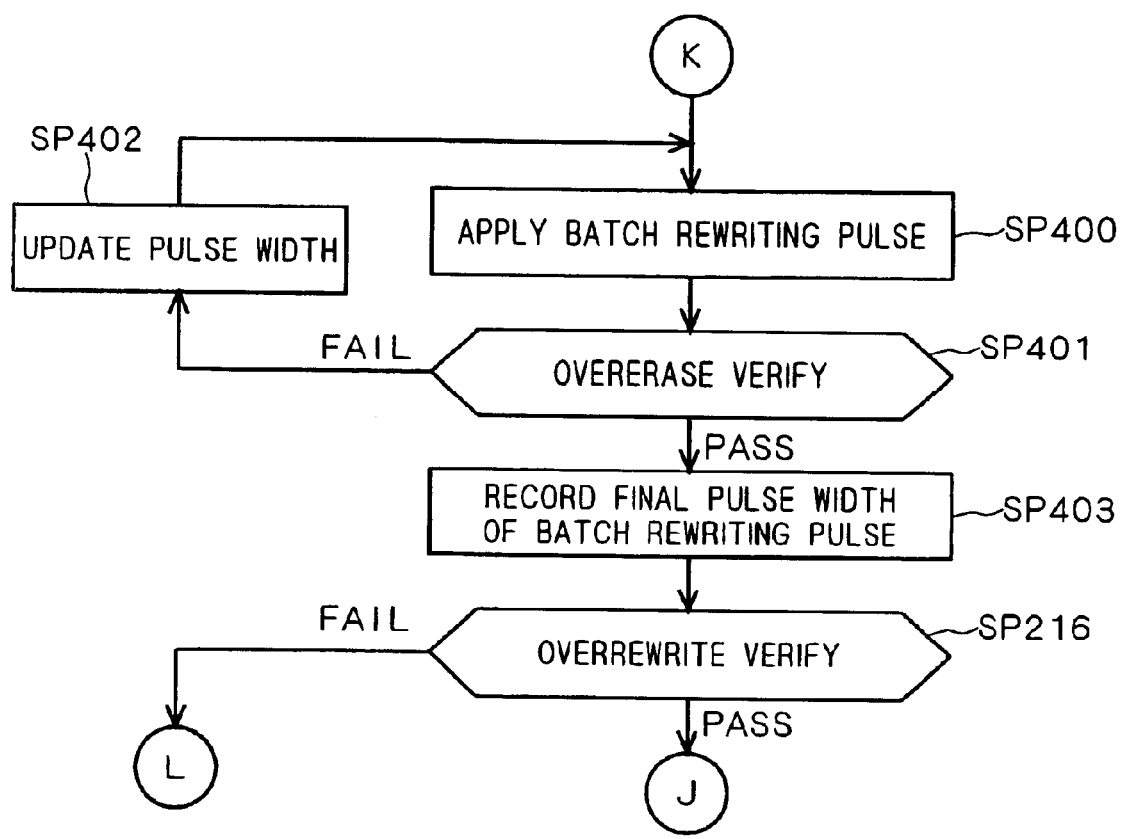
FIG. 44 is a flow chart for explaining a part of a first data erasing method in a nonvolatile semiconductor storage device according to a second variant of the second embodiment of the present invention.

FIG. 44 is a flow chart for explaining a part of a first data erasing method in a nonvolatile semiconductor storage device 1 according to the second variant of the second embodiment. If the result of the decision in the step SP210 shown in FIG. 29 is "FAIL", a batch rewriting pulse is applied to all the memory cell transistors at a step SP400.

Next, overerase verify is carried out at a step SP401. If a result of the decision in the step SP401 is "FAIL", a pulse width of a batch rewriting pulse is updated such that a pulse intensity is increased at a step SP402. Thereafter, the batch rewriting pulse having the pulse width updated is applied again at the step SP400. The operations of the steps SP400 to SP402 are repeated until the result of the decision in the step SP401 is obtained as "PASS".

Figure 45:
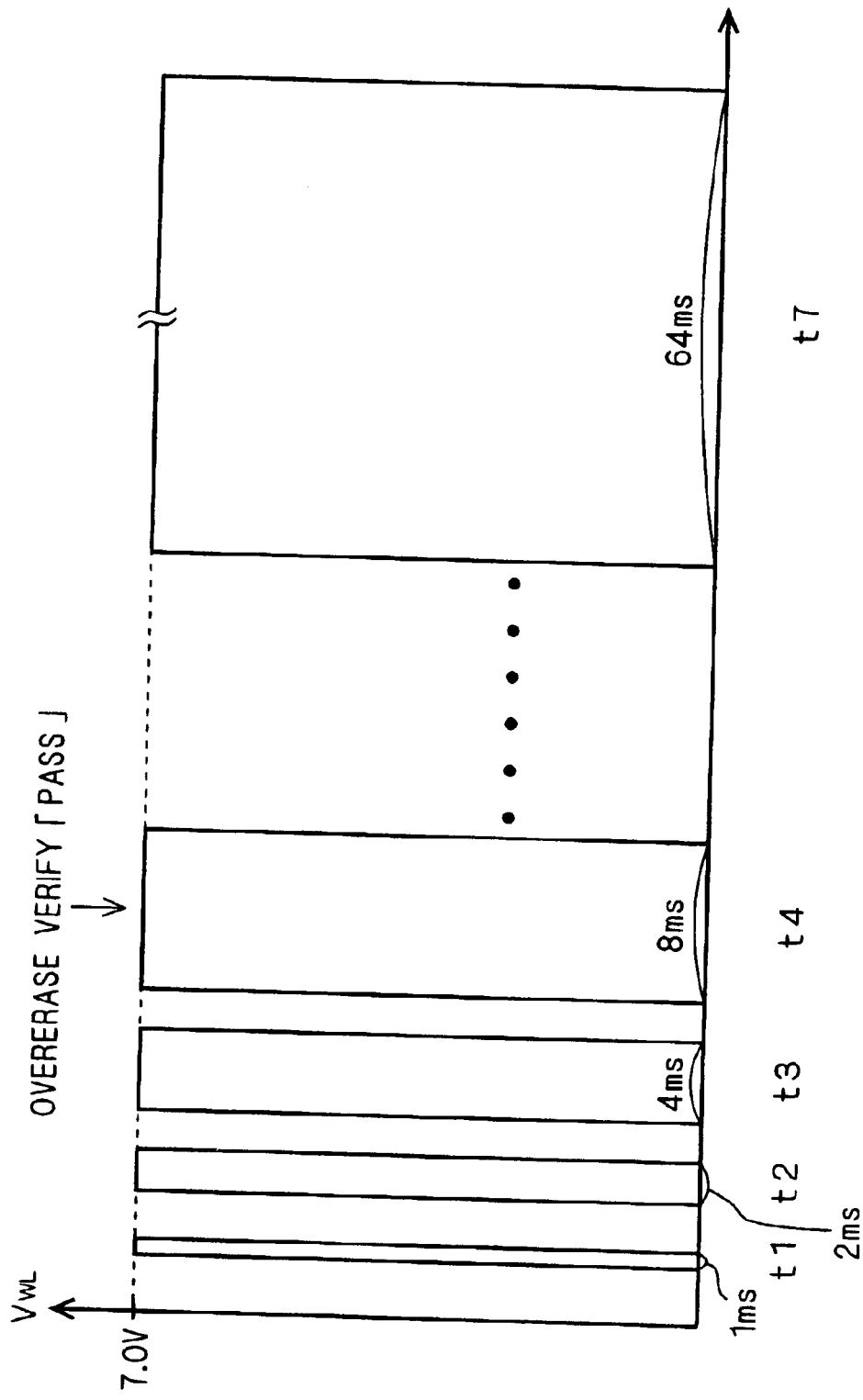
FIG. 45 is a chart showing an update status of a pulse width of a batch rewriting pulse at a step SP402.

FIG. 45 is a chart showing an update status of the pulse width of the batch rewriting pulse in the step SP402. A pulse width of a voltage pulse to be applied to a word line WL is doubled every step from 1 ms in a first step t1 to 64 ms in a seventh step t7.

With reference to FIG. 44, if the result of the decision in the step SP401 is "PASS", the process proceeds to a step SP403 in which a final pulse width of the batch rewriting pulse is recorded in the storage portion 2a shown in FIG. 1. Subsequent operations are the same as those to be carried out at and after the step SP216.

Figure 46:
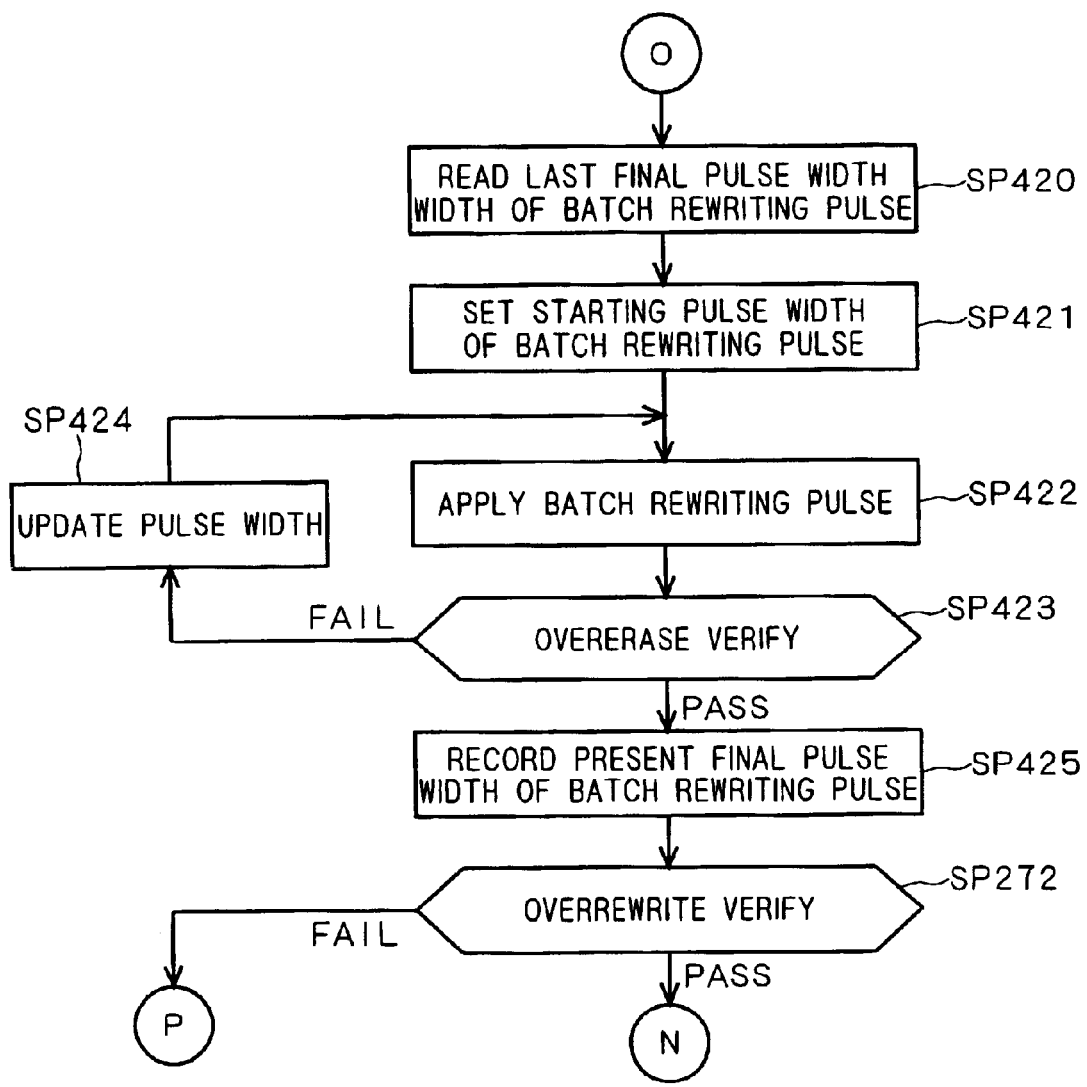
FIG. 46 is a flow chart for explaining a part of second and succeeding data erasing methods in the nonvolatile semiconductor storage device according to the second variant of the second embodiment of the present invention.
Figure 47:
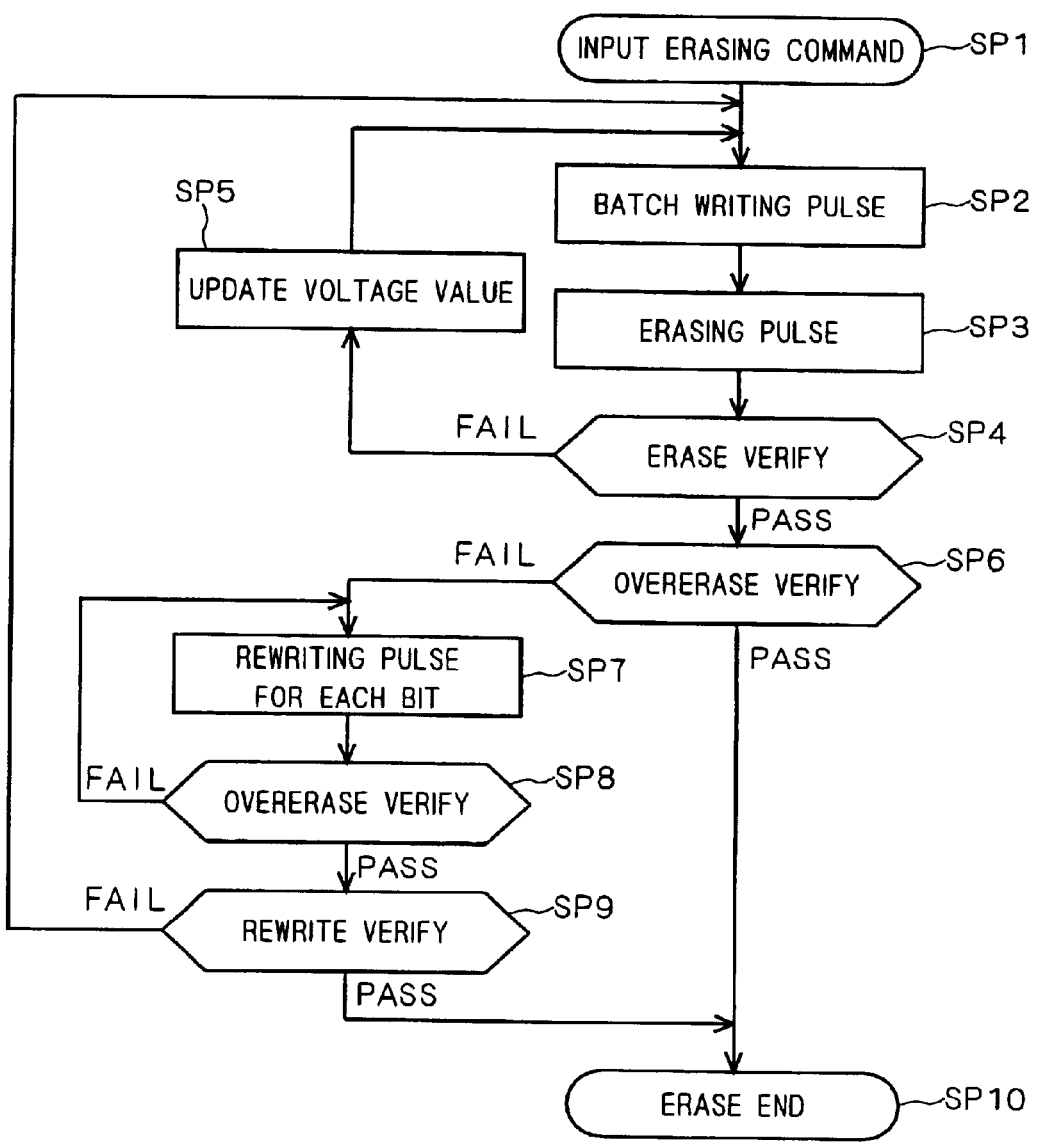
FIG. 47 is a flow chart for explaining a data erasing operation in a conventional semiconductor storage device.

FIG. 46 is a flow chart for explaining a part of second and succeeding data erasing methods in the nonvolatile semiconductor storage device 1 according to the second variant of the second embodiment. If the result of the decision in the step SP264 shown in FIG. 39 is "FAIL", a final pulse width of a batch rewriting pulse in a last data erasing operation is read from the storage portion 2a shown in FIG. 1 at a step SP420. At a step SP421, next, the control portion 2 sets a starting pulse width of a batch rewriting pulse in a present data erasing operation based on the final pulse width of the batch rewriting pulse in the last data erasing operation.

At a step SP422, next, the batch rewriting pulse having the pulse width set at the step SP421 is applied to all memory cell transistors. Then, overerase verify is carried out at a step SP423. If a result of the decision in the step SP423 is "FAIL", the process proceeds to a step SP424 in which the pulse width of the batch rewriting pulse is updated in accordance with FIG. 45 such that a pulse intensity is increased. Thereafter, the batch rewriting pulse having the pulse width updated is applied again at the step SP422. The operations of the steps SP422 to SP424 are repeated until the result of the decision in the step SP423 is obtained as "PASS".

If the result of the decision in the step SP423 is "PASS", the process proceeds to a step SP425 in which a final pulse width of the batch rewriting pulse in the present data erasing operation is recorded in the storage portion 2a shown in FIG. 1. Subsequent operations are the same as those to be carried out at and after the step SP272.

By the semiconductor storage device and data erasing method thereof according to the first and second variants, similarly, it is possible to obtain the same effects as those in the second embodiment.

While the invention has been shown and described in detail, the foregoing description is in all aspects illustrative and not restrictive. It is therefore understood that numerous modifications and variations can be devised without departing from the scope of the invention.

What is claimed is:

1. A nonvolatile semiconductor storage device comprising:
   a memory cell transistor; and
   a control portion having a storage portion and serving to control a voltage pulse to be applied to said memory cell transistor, wherein said control portion gradually increases a pulse intensity and applies a writing pulse until data are written to said memory cell transistor before an erasing pulse is applied in a data erasing operation, said storage portion stores first information about a final pulse intensity of said writing pulse in a last data erasing operation, and said control portion determines a starting value of a pulse intensity of said writing pulse in said data erasing operation based on said first information.

2. The nonvolatile semiconductor storage device according to claim 1, wherein said pulse intensity of said writing pulse is increased stepwise, and said starting value of said pulse intensity of said writing pulse in said data erasing operation is set to be smaller by a predetermined step than said final pulse intensity of said writing pulse in said last data erasing operation.

3. The nonvolatile semiconductor storage device according to claim 1, wherein said control portion gradually increases a pulse intensity and applies said erasing pulse until data of said memory cell transistor are erased in said data erasing operation, said storage portion further stores second information about a final pulse intensity of said erasing pulse in said last data erasing operation, and said control portion determines a starting value of a pulse intensity of said erasing pulse in said data erasing operation based on said second information.

4. The nonvolatile semiconductor storage device according to claim 1, wherein said control portion gradually increases a pulse intensity and applies a rewriting pulse until data are rewritten to a memory cell transistor overerased by said application of said erasing pulse if said overerased memory cell transistor is present in said data erasing operation, said storage portion further stores third information about a final pulse intensity of said rewriting pulse in said last data erasing operation, and said control portion determines a starting value of a pulse intensity of said rewriting pulse in said data erasing operation based on said third information.

5. The nonvolatile semiconductor storage device according to claim 1, wherein said storage portion is a nonvolatile semiconductor memory.

6. The nonvolatile semiconductor storage device according to claim 1, wherein said pulse intensity of said writing pulse is raised by increasing a voltage value of said writing pulse.

7. The nonvolatile semiconductor storage device according to claim 1, wherein said pulse intensity of said writing pulse is increased by enlarging a pulse width of said writing pulse.

8. A nonvolatile semiconductor storage device, comprising:

a memory cell transistor; and a control portion having a storage portion and serving to control a voltage pulse to be applied to said memory cell transistor, wherein said control portion gradually increases a pulse intensity and applies an erasing pulse until data of said memory cell transistor are erased in a data erasing operation, said storage portion stores first information about a final pulse intensity of said erasing pulse in a last data erasing operation, and said control portion determines a starting value of a pulse intensity of said erasing pulse in said data erasing operation based on said first information.

9. The nonvolatile semiconductor storage device according to claim 8, wherein said pulse intensity of said erasing pulse is increased stepwise, and said starting value of said pulse intensity of said erasing pulse in said data erasing operation is set to be smaller by a predetermined step than said final pulse intensity of said erasing pulse in said last data erasing operation.

10. The nonvolatile semiconductor storage device according to claim 8, wherein said control portion gradually increases a pulse intensity and applies a rewriting pulse until data are rewritten to a memory cell transistor overerased by said application of said erasing pulse if said overerased memory cell transistor is present in said data erasing operation, said storage portion further stores second information about a final pulse intensity of said rewriting pulse in said last data erasing operation, and said control portion determines a starting value of a pulse intensity of said rewriting pulse in said data erasing operation based on said second information.

11. The nonvolatile semiconductor storage device according to claim 8, wherein said storage portion is a nonvolatile semiconductor memory.

12. The nonvolatile semiconductor storage device according to claim 8, wherein said pulse intensity of said erasing pulse is raised by increasing a voltage value of said erasing pulse.

13. The nonvolatile semiconductor storage device according to claim 8, wherein said pulse intensity of said erasing pulse is increased by enlarging a pulse width of said erasing pulse.

14. A nonvolatile semiconductor storage device, comprising:

a memory cell transistor; and a control portion having a storage portion and serving to control a voltage pulse to be applied to said memory cell transistor, wherein said control portion gradually increases a pulse intensity and applies a rewriting pulse until data are rewritten to a memory cell transistor overerased by application of an erasing pulse if said overerased memory cell transistor is present in a data erasing operation, said storage portion stores information about a final pulse intensity of said rewriting pulse in a last data erasing operation, and said control portion determines a starting value of a pulse intensity of said rewriting pulse in said data erasing operation based on said information.

15. The nonvolatile semiconductor storage device according to claim 14, wherein said pulse intensity of said rewiring pulse is increased stepwise, and said starting value of said pulse intensity of said rewriting pulse in said data erasing operation is set to be smaller by a predetermined step than said final pulse intensity of said rewriting pulse in said last data erasing operation.

16. The nonvolatile semiconductor storage device according to claim 15, wherein said storage portion is a nonvolatile semiconductor memory.

17. The nonvolatile semiconductor storage device according to claim 15, wherein said pulse intensity of said rewriting pulse is raised by increasing a voltage value of said rewriting pulse.

18. The nonvolatile semiconductor storage device according to claim 15, wherein said pulse intensity of said rewriting pulse is increased by enlarging a pulse width of said rewriting pulse.

* * * * *